US012716136B2

(12) United States Patent
Dauenhauer et al.

(10) Patent No.: US 12,716,136 B2
(45) Date of Patent: Aug. 25, 2026

(54) CARBON-BASED CATALYTIC DEVICES

(71) Applicant: Regents of the University of Minnesota, Minneapolis, MN (US)

(72) Inventors: Paul Jakob Dauenhauer, Minneapolis, MN (US); Carl Daniel Frisbie, Minneapolis, MN (US); Tzia Ming Onn, Minneapolis, MN (US); Sallye Rose Gathmann, Minneapolis, MN (US); Yuxin Wang, Minneapolis, MN (US)

(73) Assignee: Regents of the University of Minnesota, Minneapolis, MN (US)

(*) Notice: Subject to any disclaimer, the term of this patent is extended or adjusted under 35 U.S.C. 154(b) by 0 days.

(21) Appl. No.: 18/833,132

(22) PCT Filed: Feb. 1, 2023

(86) PCT No.: PCT/US2023/012102

§ 371 (c)(1),
(2) Date: Jul. 25, 2024

(87) PCT Pub. No.: WO2023/150155

PCT Pub. Date: Aug. 10, 2023

(65) Prior Publication Data

US 2025/0146148 A1 May 8, 2025

Related U.S. Application Data

(60) Provisional application No. 63/305,549, filed on Feb. 1, 2022.

(51) Int. Cl.
*C25B 11/00* (2021.01)
*C23C 16/18* (2006.01)
(Continued)

(52) U.S. Cl.
CPC ........... *C25B 11/052* (2021.01); *C23C 16/18* (2013.01); *C23C 16/403* (2013.01);
(Continued)

(58) Field of Classification Search
CPC . C25B 11/052; C25B 11/081; C25B 11/0775; C25B 3/03; C25B 11/065;
(Continued)

(56) References Cited

U.S. PATENT DOCUMENTS

2010/0233570 A1 9/2010 Hwang et al.
2011/0089404 A1 4/2011 Marcus et al.
(Continued)

FOREIGN PATENT DOCUMENTS

WO WO 2020/176826 A1 9/2020

OTHER PUBLICATIONS

Adzic et al., "Platinum Monolayer Fuel Cell Electrocatalysts," Topics in Catalysis, Dec. 2007, 46:249-262.
(Continued)

*Primary Examiner* — James E Mcdonough
(74) *Attorney, Agent, or Firm* — Fish & Richardson P.C.

(57) ABSTRACT

Provided are carbon-based catalytic devices, methods of catalyzing one or more chemical reactions, and methods of fabricating the catalytic devices. Catalytic devices may include a catalyst material, an electrically conductive carbon material in contact with the catalyst material, an electrically conductive layer, and a dielectric material in contact with the electrically conductive carbon material and the electrically conductive layer. In some embodiments, the electrically conductive layer is configured to apply a bias voltage to the catalyst material, and the catalytic device is configured to catalyze a conversion of one or more chemical reactants to one or more chemical products.

17 Claims, 18 Drawing Sheets

(51) Int. Cl.

| | |
|---|---|
| ***C23C 16/40*** | (2006.01) |
| ***C23C 16/455*** | (2006.01) |
| ***C25B 3/03*** | (2021.01) |
| ***C25B 11/052*** | (2021.01) |
| ***C25B 11/065*** | (2021.01) |
| ***C25B 11/075*** | (2021.01) |
| ***C25B 11/077*** | (2021.01) |
| ***C25B 11/081*** | (2021.01) |

(52) U.S. Cl.
CPC .......... *C23C 16/405* (2013.01); *C23C 16/407* (2013.01); *C23C 16/45555* (2013.01); *C25B 3/03* (2021.01); *C25B 11/065* (2021.01); *C25B 11/075* (2021.01); *C25B 11/077* (2021.01); *C25B 11/0775* (2021.01); *C25B 11/081* (2021.01)

(58) Field of Classification Search
CPC ..... C25B 11/077; C25B 11/075; C23C 16/18; C23C 16/403; C23C 16/405; C23C 16/407; C23C 16/45555
USPC .......................................................... 502/174
See application file for complete search history.

(56) References Cited

U.S. PATENT DOCUMENTS

| | | | | |
|---|---|---|---|---|
| 2012/0282489 | A1 | 11/2012 | Shin et al. | |
| 2014/0034899 | A1 | 2/2014 | Ahn et al. | |
| 2015/0202606 | A1 | 7/2015 | Swager et al. | |
| 2018/0297850 | A1 | 10/2018 | Tour et al. | |
| 2018/0323406 | A1* | 11/2018 | Li | H10K 85/20 |
| 2020/0152744 | A1 | 5/2020 | Berry et al. | |

OTHER PUBLICATIONS

Allian et al., "Chemisorption of CO and Mechanism of CO Oxidation on Supported Platinum Nanoclusters," Journal of the American Chemical Society, Mar. 30, 2011, 133(12):4498-4517.
Alves et al., "Review on SiC-MOSFET Devices and Associated Gate Drivers," Presented at Proceeding of the 2018 IEEE International Conference on Industrial Technology, Lyon, France, Feb. 20-22, 2018; 2018 IEEE International Conference on Industrial Technology (ICIT), Feb. 2018, pp. 824-829.
An et al., "The Quantum Mechanics Derived Atomistic Mechanism Underlying the Acceleration of Catalytic CO Oxidation on Pt(110) by Surface Acoustic Waves," Journal of Materials Chemistry A, Jun. 14, 2016, 4(31):12036-12045.
Arai et al., "Ethanol Dehydration on Alumina Catalysts. I. The Thermal Desorption of Surface Compounds," Journal of Catalysis, Oct. 1967, 9(2):146-153.
Arakawa et al., "Optical Properties of Aluminum Oxide in the Vacuum Ultraviolet," Journal of Physics and Chemistry of Solids, May 1968, 29(5):735-744.
Ardagh et al., "Catalytic Resonance Theory: Parallel Reaction Pathway Control," Chemical Science, Mar. 3, 2020, 11(13):3501-3510.
Ardagh et al., "Catalytic Resonance Theory: SuperVolcanoes, Catalytic Molecular Pumps, and Oscillatory Steady State," Catalysis Science and Technology, Aug. 21, 2019, 9(18):5058-5076.
Ardagh et al., "Principles of Dynamic Heterogeneous Catalysis: Surface Resonance and Turnover Frequency Response," ACS Catalysis, May 22, 2019, 9(8):6929-6937.
Areán et al., "Variable-Temperature Infrared Spectroscopy: An Access to Adsorption Thermodynamics of Weakly Interacting Systems," Physical Chemistry Chemical Physics, Oct. 23, 2002, 4(23):5713-5715.
Århammar et al., "Unveiling the Complex Electronic Structure of Amorphous Metal Oxides," Proceedings of the National Academy of Sciences, Apr. 19, 2011, 108(16):6355-6360.
Babic et al., "Fates of Hydrogen During Alumina Growth Below Yttria Nodules in FeCrAl(RE) at Low Partial Pressures of Water," Electrocatalysis, Mar. 16, 2017, 8(6):565-576.
Balzarotti et al., "Electronic Structure of Aluminium Oxide as Determined by X-Ray Photoemission," Physica Status Solidi (b), Aug. 1976, 76(2):689-694.
Barteau et al., "The Adsorption of CO, O2, and H2 on Pt(100)-(5×20)," Surface Science, Jan. 1981, 102(1):99-117.
Berlowitz et al., "Kinetics of Carbon Monoxide Oxidation on Single-Crystal Palladium, Platinum, and Iridium," The Journal of Physical Chemistry, Sep. 1988, 92(18):5213-5221.
Blanck et al., "(Dis)Similarities of Adsorption of Diverse Functional Groups over Alumina and Hematite Depending on the Surface State," The Journal of Chemical Physics, Feb. 28, 2021, 154(8):084701, 10 pages.
Blaschke et al., "A correlation study of layer growth rate, thickness uniformity, stoichiometry, and hydrogen impurity level in HfO2 thin films grown by ALD between 100° C. and 350° C.," Applied Surface Science, Mar. 15, 2020, 506:144188.
Blöchl, "Projector Augmented-Wave Method," Physical Review B, Dec. 15, 1994, 50(24):17953-17979.
Bodke et al., "Oxidative Dehydrogenation of Ethane at Millisecond Contact Times: Effect of H2 Addition," Journal of Catalysis, Apr. 2000, 191(1):62-74.
Bonelli et al., "Variable-Temperature Infrared Spectroscopy Studies on the Thermodynamics of CO Adsorption on the Zeolite Ca—Y," ChemPhysChem, Aug. 25, 2008, 9(12):1747-1751.
Borchert et al., "Ligand-Capped Pt Nanocrystals as Oxide-Supported Catalysts: FTIR Spectroscopic Investigations of the Adsorption and Oxidation of CO," Angewandte Chemie International Edition, Apr. 13, 2007, 46(16):2923-2926.
Böscke et al., "Stabilization of higher-κ tetragonal HfO2 by SiO2 admixture enabling thermally stable metal-insulator-metal capacitors," Applied Physics Letters, Aug. 13, 2007, 91(7):072902, 3 pages.
Böscke et al., "Tetragonal Phase Stabilization by Doping as an Enabler of Thermally Stable HfO2 Based MIM and MIS Capacitors for Sub 50nm Deep Trench DRAM," Presented at Proceedings of the 2006 International Electron Devices Meeting, San Francisco, CA, USA, Dec. 11-13, 2006, 4 pages.
Boudart, "Heterogeneous Catalysis by Metals," Journal of Molecular Catalysis, May 1985, 30(1-2):27-38.
Bratlie et al., "Platinum Nanoparticle Shape Effects on Benzene Hydrogenation Selectivity," Nano Letters, Oct. 2007, 7(10):3097-3101.
Buscaglia et al., "Size and Scaling Effects in Barium Titanate An Overview," Journal of European Ceramic Society, Sep. 2020, 40(11):3744-3758.
CAS No. 19782-68-4, "Tetrakis(dimethylamido)hafnium(IV)," Sigma-Aldrich, retrieved on Jul. 10, 2025, retrieved from URL<https://www.sigmaaldrich.com/US/en/product/aldrich/455199?srsltid-AfmBOooY5iUqOjoJXRuQQV2nRGRVt3HqEtSPkYNXR4OyQszJWd9aEEH0>, 10 pages.
Chen et al., "Unraveling the Synergistic Effect of Re and Cs Promoters on Ethylene Epoxidation over Silver Catalysts with Machine Learning-Accelerated First-Principles Simulations," ACS Catalysis, Feb. 4, 2022, 12(4):2540-2551.
Cheng et al., "Platinum Single-Atom and Cluster Catalysis of the Hydrogen Evolution Reaction," Nature Communications, Nov. 30, 2016, 7(1):13638, 9 pages.
Cortright et al., "Hydrogen from Catalytic Reforming of Biomass-Derived Hydrocarbons in Liquid Water," Nature, Aug. 29, 2002, 418(6901):964-967.
Costina et al., "Band Gap of Amorphous and Well-Ordered Al2O3 on Ni3Al(100)," Applied Physics Letters, Jun. 25, 2001, 78(26):4139-4141.
Das et al., "Core-Shell Structured Catalysts for Thermocatalytic, Photocatalytic, and Electrocatalytic Conversion of CO2," Chemical Society Reviews, May 14, 2020, 49(10):2937-3004.
de Boer et al., "Kinetics of the Dehydration of Alcohol on Alumina," Journal of Catalysis, Feb. 1967, 7(2):163-172.
DeRita et al., "Catalyst Architecture for Stable Single Atom Dispersion Enables Site-Specific Spectroscopic and Reactivity Mea-

(56) References Cited

OTHER PUBLICATIONS surements of CO Adsorbed to Pt Atoms, Oxidized Pt Clusters, and Metallic Pt Clusters on TiO2," Journal of the American Chemical Society, Oct. 11, 2017, 139(40:14150-14165.
DeWilde et al., "Kinetics and Mechanism of Ethanol Dehydration on γ-Al2O3: The Critical Role of Dimer Inhibition," ACS Catalysis, Apr. 5, 2013, 3(4):798-807.
Diao et al., "An Investigation on the Role of Re as a Promoter in Ag—Cs—Re/α-Al2O3 High-Selectivity Ethylene Epoxidation Catalysts," Journal of Catalysis, Feb. 2015, 322:14-23.
Digne et al., "Hydroxyl Groups on γ-Alumina Surfaces: A DFT Study," Journal of Catalysis, Oct. 1, 2002, 211(1):1-5.
Digne et al., "Use of DFT to Achieve a Rational Understanding of Acid-Basic Properties of γ-Alumina Surfaces," Journal of Catalysis, Aug. 15, 2004, 226(1):54-68.
Ding et al., "Identification of Active Sites in CO Oxidation and Water-Gas Shift over Supported Pt Catalysts," Science, Oct. 9, 2015, 350(6257):189-192.
Ealet et al., "Electronic and Crystallographic Structure of γ-Alumina Thin Films," Thin Solid Films, Oct. 1994, 250(1-2):92-100.
Ernzerhof et al., "Assessment of the Perdew-Burke-Ernzerhof Exchange-Correlation Functional," Journal of Chemical Physics, Mar. 15, 1999, 110(11):5029-5036.
Ertl et al., "Chemisorption of CO on the Pt(111) Surface," Surface Science, May 1977, 64(2):393-410.
Feibelman et al., "The CO/Pt(111) Puzzle," Journal of Physical Chemistry B, May 10, 2001, 105(18):4018-4025.
Fujiwara et al., "Metal-Support Interactions in Catalysts for Environmental Remediation," Environmental Science: Nano, Sep. 12, 2017, 4(11):2076-2092.
Garrone et al., "Variable Temperature Infrared Spectroscopy: A Convenient Tool for Studying the Thermodynamics of Weak Solid-Gas Interactions," Chemical Society Reviews, 2005, 34(10):846-857.
Gathmann et al., "Catalytic Resonance Theory: Negative Dynamic Surfaces for Programmable Catalysts," Chem Catalysis, Jan. 20, 2022, 2(1):140-163.
Gawande et al., "Core-Shell Nanoparticles: Synthesis and Applications in Catalysis and Electrocatalysis," Chemical Society Reviews, Aug. 19, 2015, 44(21):7540-7590.
Gierałtowska et al., "Properties and Characterization of ALD Grown Dielectric Oxides for MIS Structures," Acta Physica Polonica A, May 2011, 119(5):692-695.
Gopeesingh et al., "Resonance-Promoted Formic Acid Oxidation via Dynamic Electrocatalytic Modulation," ACS Catalysis, Jul. 13, 2020, 10(17):9932-9942.
Grabow et al., "Understanding Trends in Catalytic Activity: The Effect of Adsorbate-Adsorbate Interactions for CO Oxidation Over Transition Metals," Topics in Catalysis, May 2010, 53:298-310.
Greeley et al., "Alloys of Platinum and Early Transition Metals as Oxygen Reduction Electrocatalysts," Nature Chemistry, Oct. 2009, 1(7):552-556.
Grimme eta l., "A Consistent and Accurate Ab Initio Parametrization of Density Functional Dispersion Correction (DFT-D) for the 94 Elements H—Pu," Journal of Chemical Physics, Apr. 21, 2010, 132(15):154104, 19 pages.
Grinberg et al., "CO on PT(111) Puzzle: A Possible Solution," Journal of Chemical Physics, Aug. 2002, 117(5):2264-2270.
Guillaume et al., "Characterization of Acid Sites on γ-Alumina and Chlorinated γAlumina By 31P NMR of Adsorbed Trimethylphosphine," Catalysis Letters, Feb. 1997, 43:213-218.
Gunasooriya et al., "CO Adsorption on Pt(111): From Isolated Molecules to Ordered High-Coverage Structures," ACS Catalysis, Sep. 21, 2018, 8(11):10225-10233.
Gunasooriya et al., "CO Adsorption Site Preference on Platinum: Charge Is the Essence," ACS Catalysis, Mar. 26, 2018, 8(5):3770-3774.
Gutiérrez et al., "Theoretical structure determination of γ-Al2O3," Physical Review B, Nov. 29, 2001, 65(1):012101, 4 pages.
Hannagan et al., "First-Principles Design of a Single-Atom-Alloy Propane Dehydrogenation Catalyst," Science, Jun. 25, 2021, 372(6549):1444-1447.
Hannagan et al., "Single-Atom Alloy Catalysis," Chemical Reviews, Jun. 26, 2020, 120(21):12044-12088.
Hansgen et al., "Ammonia Decomposition Activity on Monolayer Ni Supported on Ru, Pt and WC Substrates," Surface Science, Dec. 2011, 605(23-24):2055-2060.
Hansgen et al., "Using First Principles to Predict Bimetallic Catalysts for the Ammonia Decomposition Reaction," Nature Chemistry, Jun. 2010, 2(6):484-489.
Harris, "Growth and Structure of Supported Metal Catalyst Particles," International Materials Reviews, Jan. 1995, 40(3):97-115.
He et al., "Effect of postdeposition annealing on the thermal stability and structural characteristics of sputtered HfO2 films on Si (100)," Surface Science, Feb. 2005, 576(1-3):67-75.
Henkelman et al., "A Fast and Robust Algorithm for Bader Decomposition of Charge Density," Computational Materials Science, Jun. 2006, 36(3):354-360.
Henkelman et al., "Improved Tangent Estimate in the Nudged Elastic Band Method for Finding Minimum Energy Paths and Saddle Points," Journal of Chemical Physics, Dec. 8, 2000, 113(22):9978-9985.
Hohenberg et al., "Inhomogeneous Electron Gas," Physical Review, Nov. 9, 1964, 136(3B):864-871.
Holmberg et al., "Charge Distribution and Fermi Level in Bimetallic Nanoparticles," Physical Chemistry Chemical Physics, Dec. 23, 2015, 18(4):2924-2931.
Horn et al., "Spatial and Temporal Profiles in Millisecond Partial Oxidation Processes," Catalysis Letters, Sep. 2006, 110:169-178.
Hu et al., "High Field 27Al MAS NMR and TPD Studies of Active Sites in Ethanol Dehydration Using Thermally Treated Transitional Aluminas as Catalysts," Journal of Catalysis, Apr. 2016, 336:85-93.
International Preliminary Report on Patentability in International Appln. No. PCT/US2023/012102, mailed on Aug. 15, 2024, 6 pages.
International Search Report and Written Opinion in International Appln. No. PCT/US2023/012102, mailed on Apr. 27, 2023, 8 pages.
Janthon et al., "Adding Pieces to the CO/Pt(111) Puzzle: The Role of Dispersion," Journal of Physical Chemistry C, Feb. 1, 2017, 121(7):3970-3977.
Jenness et al., "Site-Dependent Lewis Acidity of γ-Al2O3 and Its Impact on Ethanol Dehydration and Etherification," Journal of Physical Chemistry C, Jun. 19, 2014, 118(24):12899-12907.
Jeong et al., "Thickness Scaling of Atomic-Layer-Deposited HfO2 Films and Their Application to Wafer-Scale Graphene Tunnelling Transistors," Scientific Reports, Feb. 10, 2016, 6(1):20907, 12 pages.
Jimenéz-Gonzaléz et al., "Preparation and Spectroscopic Characterization of γ-Al2O3 Thin Films," Surface Science, Jul. 2, 1991, 250(1-3):59-70.
Johnson eta l., "A Brief Review of Atomic Layer Deposition: From Fundamentals to Applications," Materials Today, Jun. 2014, 17(5):236-246.
Jung et al., "The Effects of Postdeposition Annealing on the Crystallization and Electrical Characteristics of HfO2 and ZrO2 Gate Dielectrics," Electrochemical and Solid-State Letters, Feb. 18, 2011, 14(5):G17-G19.
Kim et al., "Field Effect Modulation of Outer-Sphere Electrochemistry at Back-Gated, Ultrathin ZnO Electrodes," Journal of the American Chemical Society, Jun. 15, 2016, 138(23):7220-7223.
Kohn et al., "Self-Consistent Equations Including Exchange and Correlation Effects," Physical Review, Nov. 15, 1965, 140(4A):A1133-A1138.
Kondo et al., "Promoted Catalytic Activity of a Platinum Monolayer Cluster on Graphite," Journal of Physical Chemistry C, Oct. 9, 2008, 112(40):15607-15610.
Kostestkyy et al., "Structure-Activity Relationships on Metal-Oxides: Alcohol Dehydration," Catalysis Science & Technology, Jun. 11, 2014, 4(11):3861-3869.
Kresse et al., "Ab initio molecular dynamics for liquid metals," Physical Review B, Jan. 1993, 47(1):558-561.

(56) References Cited

OTHER PUBLICATIONS

Kresse et al., "Ab initio molecular-dynamics simulation of the liquid-metal-amorphous-semiconductor transition in germanium," Physical Review B, May 15, 1994, 49(20):14251-14269.
Kresse et al., "Efficiency of Ab-Initio Total Energy Calculations for Metals and Semiconductors Using a Plane-Wave Basis Set," Computational Materials Science, Jul. 1996, 6(1):15-50.
Kresse et al., "Efficient iterative schemes for ab initio total-energy calculations using a plane-wave basis set," Physical Review B, Oct. 15, 1996, 54(16):1169-11186.
Kresse et al., "From Ultrasoft Pseudopotentials to the Projector Augmented-Wave Method," Physical Review B, Jan. 15, 1999, 59(3):1758-1775.
Kwak et al., "(100) Facets of γ-Al2O3: The Active Surfaces for Alcohol Dehydration Reactions," Catalysis Letters, May 2011, 141:649-655.
Lan et al., "First-Principles Simulations of an Aqueous CO/Pt(111) Interface," Journal of Physical Chemistry C, Oct. 2018, 122(42):24068-24076.
Larmier et al., "Mechanistic Investigation of Isopropanol Conversion on Alumina Catalysts: Location of Active Sites for Alkene/Ether Production," ACS Catalysis, Jul. 2, 2015, 5(7):4423-4437.
Larsen et al., "The Atomic Simulation Environment—A Python Library for Working with Atoms," Journal of Physics: Condensed Matter, Jun. 7, 2017, 29(27):273002.
Lee et al., "Chiral Templating of Surfaces: Adsorption of (S)-2-Methylbutanoic Acid on Pt(111) Single-Crystal Surfaces," Journal of the American Chemical Society, Jul. 2006, 128(27):8890-8898.
Luo et al., "CO Adsorption Site Occupation on Pt(335): A Quantitative Investigation Using TPD and EELS," Surface Science, Jul. 15, 1992, 274(1):53-62.
Marakatti et al., "Synthetically Tuned Electronic and Geometrical Properties of Intermetallic Compounds as Effective Heterogeneous Catalysts," Progress in Solid State Chemistry, Dec. 2018, 52:1-30.
Mathew et al., "Implicit Self-Consistent Electrolyte Model in Plane-Wave Density-Functional Theory," Journal of Chemical Physics, Dec. 21, 2019, 151(23):234101, 8 pages.
Mathew et al., "Implicit Solvation Model for Density-Functional Study of Nanocrystal Surfaces and Reaction Pathways," Journal of Chemical Physics, Feb. 28, 2014, 140(8):084106, 8 pages.
McCabe et al., "Binding States of CO and H2 on Clean and Oxidized (111)Pt.," Surface Science, Jun. 1977, 65(1):189-209.
Mitchell et al., "Atomically Precise Control in the Design of Low-Nuclearity Supported Metal Catalysts," Nature Reviews Materials, Nov. 2021, 6(11):969-985.
Moon et al., "Layer-Engineered Large-Area Exfoliation of Graphene," Science Advances, Oct. 28, 2020, 6(44):abc6601, 7 pages.
Morozan et al., "Low-Platinum and Platinum-Free Catalysts for the Oxygen Reduction Reaction at Fuel Cell Cathodes," Energy & Environmental Science, Mar. 8, 2011, 4(4):1238-1254.
Narayanan et al., "The Effect of Alumina Structure on Surface Sites for Alcohol Dehydration," Journal of Catalysis, Dec. 1992, 138(2):659-674.
Nørskov et al., "Density Functional Theory in Surface Chemistry and Catalysis," Proceedings of the National Academy of Sciences, Jan. 18, 2011, 108(3):937-943.
Nørskov et al., "The Nature of the Active Site in Heterogeneous Metal Catalysis," Chemical Society Reviews, Aug. 4, 2008, 37(10):2163-2171.
Onn et al., "Alumina Graphene Catalytic Condenser for Programmable Solid Acids," JACS Au, May 7, 2022, 2(5):1123-1133.
Onn et al., "Platinum Graphene Catalytic Condenser for Millisecond Programmable Metal Surfaces," JACS, Nov. 16, 2022, 144(48):22113-22127.
Park et al., "Adsorption and Interaction of CO and NO on Pt(410): I. TPD Studies," Surface Science, Jun. 1985, 155(1):341-365.
Parry, "An Infrared Study of Pyridine Adsorbed on Acidic Solids. Characterization of Surface Acidity," Journal of Catalysis, Oct. 1963, 2(5):371-379.
Perdew et al., "Generalized Gradient Approximation Made Simple," Physical Review Letters, Oct. 28, 1996, 77(18):3865-3868.
Pines et al., "Alumina: Catalyst and Support. I. Alumina, Its Intrinsic Acidity and Catalytic Activity1," Journal of the American Chemical Society, May 1960, 82(10):2471-2483.
Redhead, "Thermal Desorption of Gases," Vacuum, Jul. 1962, 12(4):203-211.
Reina et al., "Transferring and Identification of Single- and Few-Layer Graphene on Arbitrary Substrates," Journal of Physical Chemistry C, Nov. 20, 2008, 112(46):17741-17744.
Resasco et al., "Combining In-Situ Transmission Electron Microscopy and Infrared Spectroscopy for Understanding Dynamic and Atomic-Scale Features of Supported Metal Catalysts," Journal of Physical Chemistry C, Jun. 20, 2018, 122(44):25143-25157.
Roy et al., "Mechanistic Study of Alcohol Dehydration on γ-Al2O3," ACS Catalysis, Sep. 7, 2012, 2(9):1846-1853.
Schiliro et al., "Substrate-Driven Atomic Layer Deposition of High-κ Dielectrics on 2D Materials," Applied Sciences, Nov. 22, 2021, 11(22):11052, 19 pages.
Shetty et al., "Electric-Field-Assisted Modulation of Surface Thermochemistry," ACS Catalysis, Oct. 20, 2020, 10(21):12867-12880.
Shetty et al., "The Catalytic Mechanics of Dynamic Surfaces: Stimulating Methods for Promoting Catalytic Resonance," ACS Catalysis, Sep. 25, 2020, 10(21):12666-12695.
Shi et al., "Alcohol Dehydration: Mechanism of Ether Formation Using an Alumina Catalyst," Journal of Catalysis, Dec. 1995, 157(2):359-367.
Shigeishi et al., "Chemisorption of Carbon Monoxide on Platinum {111}: Reflection-Absorption Infrared Spectroscopy," Surface Science, Jan. 1976, 58(2):379-396.
Shizhong, "Catalytic Resonance of Ammonia Synthesis by Simulated Dynamic Ruthenium Crystal Strain," Science Advances, Jan. 26, 2022, 8(4):eabl6576, 9 pages.
Siburian et al., "The Loading Effect of Pt Clusters on Pt/Graphene Nano Sheets Catalysts," Scientific Reports, Jan. 28, 2021, 11(1):2532, 13 pages.
Siddiqui et al., "Co Adsorption Site Exchange between Step and Terrace Sites on Pt(112)," Surface Science, Jan. 1987, 191(1-2):L813-L818.
Suk et al., "Transfer of CVD-Grown Monolayer Graphene onto Arbitrary Substrates," ACS Nano, Sep. 27, 2011, 5(9):6916-6924.
Sun et al., "Single-Atom Catalysis Using Pt/Graphene Achieved through Atomic Layer Deposition," Scientific Reports, May 3, 2013, 3(1):1775, 9 pages.
Tang et al., "A Grid-Based Bader Analysis Algorithm without Lattice Bias," Journal of Physics: Condensed Matter, Jan. 30, 2009, 21(8):084204, 7 pages.
Thang et al., "Nature of Stable Single Atom Pt Catalysts Dispersed on Anatase TiO2," Journal of Catalysis, Nov. 2018, 367:104-114.
Trueba et al., "β-Alumina as a Support for Catalysts: A Review of Fundamental Aspects," European Journal of Inorganic Chemistry, Sep. 2005, 17:3393-3403.
Vajda et al., "Subnanometre Platinum Clusters as Highly Active and Selective Catalysts for the Oxidative Dehydrogenation of Propane," Nature Materials, Mar. 2009, 8(3):213-216.
Van Deelen et al., "Control of Metal-Support Interactions in Heterogeneous Catalysts to Enhance Activity and Selectivity," Nature Catalysis, Nov. 2019, 2(11):955-970.
Vargas et al., "Structure and Optical Properties of Nanocrystalline Hafnium Oxide Thin Films," Optical Materials, Nov. 2014, 37:621-628.
Vervuurt et al., "Uniform Atomic Layer Deposition of Al2O3 on Graphene by Reversible Hydrogen Plasma Functionalization," Chemistry of Materials, Mar. 14, 2017, 29(5):2090-2100.
Vogt et al., "The Concept of Active Site in Heterogeneous Catalysis," Nature Reviews Chemistry, Feb. 2022, 6(2):89-111.
Wang et al., "Field Effect Modulation of Electrocatalytic Hydrogen Evolution at Back-Gated Two-Dimensional MoS2 Electrodes," Nano Letters, Aug. 21, 2019, 19(9):6118-6123.
Wang et al., "Field Effect Modulation of Heterogeneous Charge Transfer Kinetics at Back-Gated Two-Dimensional MoS2 Electrodes," Nano Letters, Dec. 13, 2017, 17(12):7586-7592.

(56) References Cited

OTHER PUBLICATIONS

Wang et al., "Single-Crystal, Large-Area, Fold-Free Monolayer Graphene," Nature, Aug. 2021, 596(7873):519-524.
Wu et al., "A Two-Dimensional MoS2 Catalysis Transistor by Solid-State Ion Gating Manipulation and Adjustment (SIGMA)," Nano Letters, Sep. 9, 2019, 19(10):7293-7300.
Xie et al., "The Influence of Mixed Phases on Optical Properties of HfO2 Thin Films Prepared by Thermal Oxidation," Journal of Materials Research, Jan. 2011, 26:50-54.
Yang et al., "Epitaxial SrTiO3 Films with Dielectric Constants Exceeding 25,000," Proceedings of the National Academy of Sciences, Jun. 7, 2022, 119(23):e2202189119, 5 pages.
Yang et al., "High Activity toward the Hydrogen Evolution Reaction on the Edges of MoS2-Supported Platinum Nanoclusters Using Cluster Expansion and Electrochemical Modeling," Chemistry of Materials, Jan. 7, 2020, 32(3):1315-1321.
Yang et al., "Intermetallic Compound Catalysts: Synthetic Scheme, Structure Characterization and Catalytic Application," Journal of Materials Chemistry A, Feb. 7, 2020, 8(5):2207-2221.
Yu et al., "Accurate and Efficient Algorithm for Bader Charge Integration," Journal of Chemical Physics, Feb. 14, 2011, 134(6):064111, 8 pages.
Zhai et al., "Alkali-Stabilized Pt—OH x Species Catalyze Low-Temperature Water-Gas Shift Reactions," Science 2010, 329, 1633-1636.
Zhang et al., "Direct Growth of High-Quality Al2O3 Dielectric on Graphene Layers by Low-Temperature H2O-Based ALD," Journal of Physics D: Applied Physics, Jan. 3, 2014, 47(5):055106, 6 pages.
Zhang et al., "Gold-Platinum Bimetallic Nanoclusters for Oxidase-like Catalysis," ACS Applied Nano Materials, Aug. 13, 2020, 3(9):9318-9328.
Zhang et al., "Selective Hydrogenation over Supported Metal Catalysts: From Nanoparticles to Single Atoms," Chemical Reviews, Sep. 24, 2019, 120(2):683-733.
Zhang et al., "Temperature-Dependent HfO2/Si Interface Structural Evolution and Its Mechanism," Nanoscale Research Letters, Dec. 2019, 14:83, 8 pages.
Extended European Search Report in European Appln. No. 23750135.8, mailed on Jan. 2, 2026, 13 pages.

* cited by examiner

CARBON-BASED CATALYTIC DEVICES

CROSS-REFERENCE TO RELATED APPLICATIONS

This application is a National Stage application under 35 U.S.C. § 371 of International Application No. PCT/US2023/012102, having an International Filing Date of Feb. 1, 2023, which claims the benefit under 35 U.S.C. § 119 (e) of U.S. provisional application No. 63/305,549, filed Feb. 1, 2022, each of which is incorporated by reference herein in its entirety.

STATEMENT OF GOVERNMENT INTEREST

This invention was made with government support under NSF 1937641 awarded by the National Science Foundation. The government has certain rights in the invention.

TECHNICAL FIELD

This invention relates to devices and methods for increasing chemical reaction rates by varying the binding energy of substrates to the surfaces of the devices.

BACKGROUND

Traditional metal-oxide-semiconductor field effect transistors (MOSFET) alter charge carrier density in semiconductor layers with high-k dielectric oxide layers. Gate potential variation then manipulates the electronic bands of the semiconductor between high and low conductivity.

SUMMARY

Provided herein are catalytic devices. In some embodiments, the catalytic devices include a catalyst material, an electrically conductive carbon material in contact with the catalyst material, an electrically conductive layer, and a dielectric material in contact with the electrically conductive carbon material and the electrically conductive layer. In some embodiments, the electrically conductive layer is configured to apply a bias voltage to the catalyst material, and the catalytic device is configured to catalyze a conversion of one or more chemical reactants to one or more chemical products.

In some embodiments, the electrically conductive carbon material includes one or more of graphene, porous graphene foams or sheets, carbon nanotubes, amorphous carbon film, carbon fiber, graphite, activated carbon, carbon black, diamond, fullerenes, carbon felt, carbon foam, carbon paper, carbon brush, and carbon cloth.

In some embodiments, the electrically conductive carbon material includes one or more of graphene and carbon nanotubes. In some embodiments, the electrically conductive carbon material includes graphene. In some embodiments, the electrically conductive carbon material includes a single layer of graphene or multiple layers of graphene.

In some embodiments, the catalyst material includes one or more of a metal oxide, a mixed metal oxide, a metal, a metal dichalcogenide, and a mixture of metals.

In some embodiments, the metal oxide or mixed metal oxide includes one or more of aluminum oxide, titanium oxide, zinc oxide, cobalt oxide, iron oxide, copper oxide, copper zinc oxide, ruthenium oxide, tungsten oxide, aluminum phosphate, vanadium oxide, vanadium molybdenum oxide, zirconium oxide, vanadium oxide, cerium oxide, and manganese oxide. In some embodiments, the metal oxide or mixed metal oxide includes one or more of aluminum oxide, titanium oxide, zinc oxide, cobalt oxide, iron oxide, copper zinc oxide, vanadium oxide, ruthenium oxide, and tungsten oxide.

In some embodiments, the metal or mixture of metals includes one or more of Ru, Pt, Cu, Pd, Ni, Ag, Au, Fe, Co, Ir, and Mo. In some embodiments, the metal or mixture of metals includes one or more of Ru, Pt, Cu, Pd, Ni, and Ag.

In some embodiments, the metal dichalcogenide includes one or more of $MoS_2$, $WSe_2$, $MoSe_2$, and $WS_2$.

In some embodiments, the catalyst material is in the form of a continuous film, single atoms, nanoclusters, clusters, a two-dimensional material, or discontinuous film.

In some embodiments, the dielectric material includes one or more of hafnium oxide, hafnium dioxide, silicon dioxide, titania, titanium oxide, zirconium dioxide, barium titanate, potassium niobate, titanate, lithium tantalite, tantalum pentoxide and strontium titanate. In some embodiments, the dielectric material includes a ferroelectric material or a paraelectric material. In some embodiments, the dielectric material includes a doped material.

In some embodiments, the electrically conductive layer includes silicon or a metal.

In some embodiments, the dielectric material has a thickness of about 0.5 nm to about 2 mm. In some embodiments, the dielectric material has a thickness of about 5 nm to about 100 nm.

In some embodiments, the electrically conductive carbon material has a thickness of about 70 pm to about 100 mm. In some embodiments, the electrically conductive carbon material has a thickness of about 70 pm to about 100 nm.

In some embodiments, the catalyst material has a thickness of about 70 pm to about 100 nm.

In some embodiments, the catalytic device includes a first layer including the electrically conductive layer in contact with a second layer including the dielectric material. In some embodiments, the second layer is in contact with a third layer including the electrically conductive carbon material. In some embodiments, the third layer is in contact with a fourth layer including the catalyst material. In some embodiments, the first layer includes at least one surface in contact with the second layer, wherein the surface of the first layer is a smooth surface, a rough surface, or a patterned surface.

Also provided herein are methods of catalyzing a conversion of one or more chemical reactants to one or more chemical products. In some embodiments, the method includes contacting the catalyst material of the catalytic device with the one or more chemical reactants, and applying the bias voltage to the catalyst material to yield the one or more chemical products.

In some embodiments, the bias voltage is applied in a range of about −100 V to about 100 V. In some embodiments, the bias voltage is applied in a range of about −20 V to about 20 V.

In some embodiments, the bias voltage has a frequency in a range of about 0.01 Hz to about 100 MHz.

In some embodiments, the bias voltage is applied statically. In some embodiments, the bias voltage is applied dynamically.

In some embodiments, the bias voltage has an amplitude in a range of about −100 V to about 100 V.

In some embodiments, the one or more chemical reactants are reduced, oxidized, combined, condensed, decomposed, hydrogenated, deoxygenated, desulfurized, reformed, or dehydrated by the catalytic device. In some embodiments, the one or more chemical reactants include one or more of a nitro compound, ethylene, ethane, propane, butane, methane, propylene, and carbon dioxide.

In some embodiments, the one or more chemical products include one or more of hydrogen peroxide, oxygen ($O_2$), hydrogen ($H_2$), ammonia, carbon dioxide, methanol, ethanol, carbon monoxide, an amine, dimethyl ether, ethylene oxide, ethylene, propylene, butene, butadiene, propylene oxide, and carbon monoxide.

Also provided herein are methods of fabricating a catalytic device. In some embodiments, the method includes disposing a dielectric layer on an electrically conductive layer, disposing an electrically conductive carbon material on the dielectric layer, disposing a catalyst material on the electrically conductive carbon material, the dielectric layer or both, and electrically coupling the electrically conductive layer and the catalyst material.

In some embodiments, disposing the dielectric layer on the electrically conductive layer includes exposing a conductive substrate material to a first gaseous inorganic precursor via atomic layer deposition to form the dielectric layer on the electrically conductive layer.

In some embodiments, disposing the electrically conductive carbon material on the dielectric layer includes transferring the electrically conductive carbon material to the dielectric layer to form a layer of the electrically conductive carbon material on the dielectric layer. In some embodiments, transferring the electrically conductive carbon material to the dielectric layer to form a layer of the electrically conductive carbon material on the dielectric layer includes exposing the dielectric layer to a first carbon material precursor, made via chemical vapor deposition.

In some embodiments, disposing the catalyst material on the electrically conductive carbon material, the dielectric layer, or both includes exposing the dielectric layer, the electrically conductive carbon material, or both to a second gaseous inorganic precursor via atomic layer deposition. In some embodiments, disposing the catalyst material on the electrically conductive carbon material, the dielectric layer, or both includes exposing the dielectric layer, the electrically conductive carbon material, or both to a second gaseous inorganic precursor via solution-based incipient wetness impregnation.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

The present disclosure provides carbon-based catalytic devices. In some embodiments, the catalytic devices disclosed herein comprise a catalyst material, an electrically conductive carbon material in contact with the catalyst material, an electrically conductive layer, and a dielectric material in contact with the electrically conductive carbon material and the electrically conductive layer. In some embodiments, the electrically conductive layer is configured to apply a bias voltage to the catalyst material, and the catalytic device is configured to catalyze a conversion of one or more chemical reactants to one or more chemical products.

The catalytic devices as disclosed herein, advantageously, allow for low-conductivity through materials with active sites, such as alumina or discontinuous active site layers. When the catalyst, such as a discontinuous layer of alumina or nanoparticles of copper, is deposited on a conductive carbon layer, charge distribution occurs over the long length scale (mm to cm) in carbon and only moves into the catalyst layer in the last nm. This two-part design permits rapid charge distribution and control of catalytic sites in unconventional electronic materials.

The design of the catalytic devices includes the selection of materials composition, materials state (phase), geometry, surface features, and inter-material contact. Variation of these design parameters alters the physical and electronic state of the exposed active surface of the catalytic devices, providing variable applicability for adsorption and catalysis.

Figure 1:
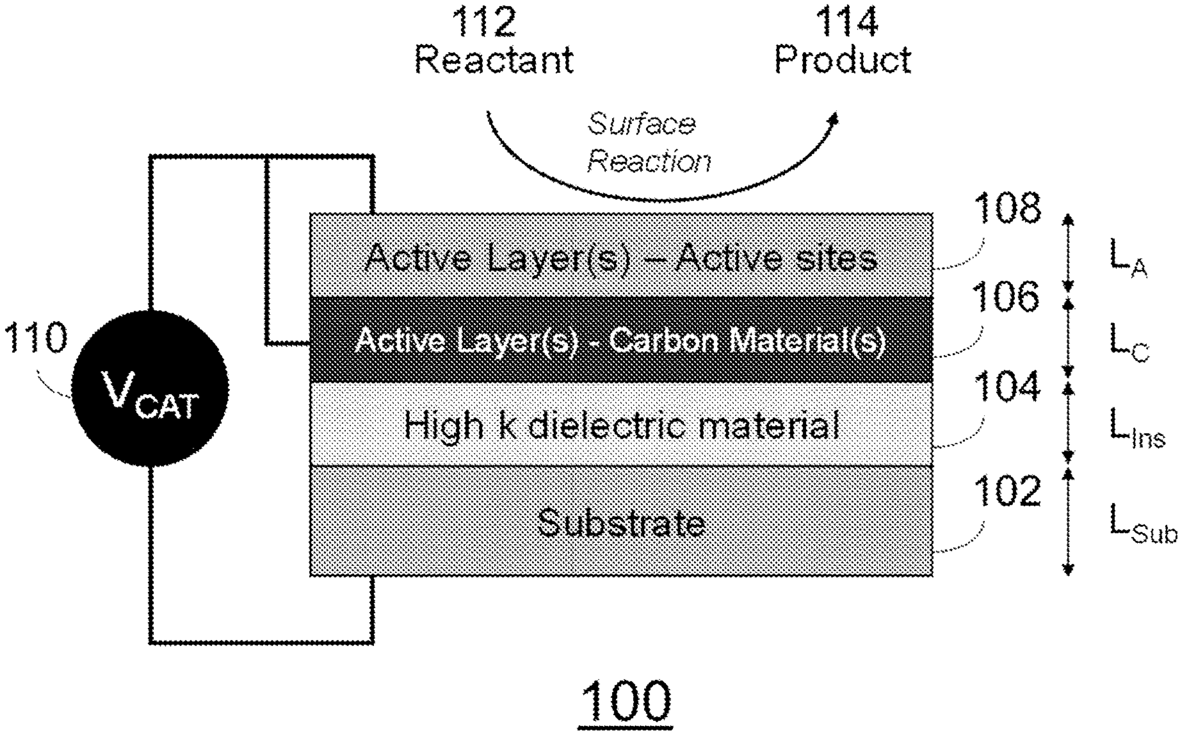
FIG. 1 depicts an example of a catalytic device as disclosed herein with a continuous catalyst material layer.
Figure 2:
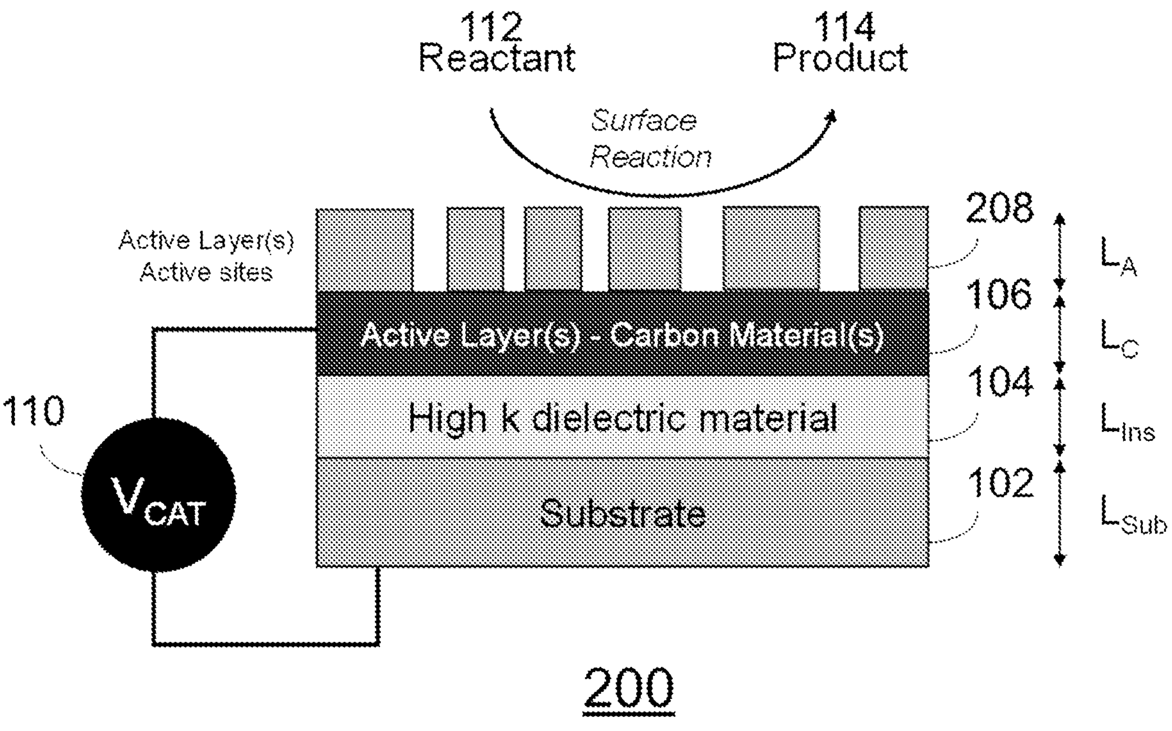
FIG. 2 depicts an example of a catalytic device as disclosed herein with a discontinuous catalyst material layer.

FIGS. 1 and 2 depict embodiments of carbon-based catalytic devices 100 and 200 including substrate 102, a dielectric material 104, an electrically conductive carbon material 106, and a catalyst material 108 or 208. The electrically conductive carbon material 106 is in contact with the catalyst material 108 or 208, and the dielectric material 104 is in contact with the electrically conductive carbon material 106 and the substrate 102. The substrate 102 is configured to apply a bias voltage 110 to the catalyst material, and the catalytic device 100 or 200 is configured to catalyze a conversion of one or more chemical reactants 112 to one or more chemical products 114.

In some embodiments of the catalytic devices as disclosed herein, at least a portion of substrate 102 is electrically conductive. In some embodiments, substrate 102 is or includes an electrically conductive layer. In some embodiments, the substrate 102 includes an electrically conductive material and a nonelectrically conductive material. The electrically conductive material can be in the form of a layer on the nonelectrically conductive material. In some embodiments, the electrically conductive material includes silicon, a metal, or both silicon and a metal.

Embodiments of the catalytic devices as disclosed herein include a dielectric material 104 in contact with the electrically conductive carbon material 106 and the substrate 102. In some embodiments, the dielectric material includes a high-k dielectric material. For example, the dielectric material may refer to "High k dielectric material" as labeled in FIGS. 1 and 2, or the "High-k Dielectric Insulator" as labeled in FIGS. 3 and 4. As used herein, the term "high-k dielectric material" (also referred to as "high-k dielectric insulator") refers to a material with a high dielectric constant, such as a dielectric constant of at least 7, at least 5, or at least 2. In some embodiments, the dielectric material includes one or more of hafnium oxide, hafnium dioxide, silicon dioxide, titania, titanium oxide, zirconium dioxide, barium titanate, potassium niobate, titanate, lithium tantalite, tantalum pentoxide and strontium titanate. In some embodiments, the dielectric material includes a ferroelectric material or a paraelectric material. In some embodiments, the dielectric material includes a doped material. In some embodiments, the dielectric material 104 has a thickness of about 0.5 nm to about 2 mm, or about 5 nm to about 100 nm.

Embodiments of the catalytic devices as disclosed herein include an electrically conductive carbon material 106 that is in contact with the catalyst material 108. For example, the electrically conductive carbon material may refer to "Active Layer(s)—Carbon Material(s)" as labeled in FIGS. 1 and 2, and may be referred to herein as the "carbon material," "carbon-containing layer," or "carbon layer." In some embodiments, the electrically conductive carbon material 106 includes one or more of graphene, porous graphene foams or sheets, carbon nanotubes, amorphous carbon film, carbon fiber, graphite, activated carbon, carbon black, diamond, fullerenes, carbon felt, carbon foam, carbon paper, carbon brush, and carbon cloth. In some embodiments, the electrically conductive carbon material 106 includes one or more of graphene and carbon nanotubes. In some embodiments, the electrically conductive carbon material 106 includes graphene. In some embodiments, the electrically conductive carbon material 106 is graphene. In some embodiments, the electrically conductive carbon material 106 includes a single layer of graphene or multiple layers of graphene. In some embodiments, the electrically conductive carbon material 106 has a thickness of about 70 pm to about 100 mm, or about 70 pm to about 100 nm.

Embodiments of the catalytic devices as disclosed herein include a catalyst material 108. For example, the catalyst material may refer to "Active Layer(s)—Active Sites" as labeled in FIGS. 1 and 2, and may be referred to herein as the "active site," "active site material," or active site layer." In some embodiments, the catalyst material includes one or more of a metal oxide, a mixed metal oxide, a metal, a metal dichalcogenide, and a mixture of metals. In some embodiments, the metal oxide or mixed metal oxide includes one or more of aluminum oxide, titanium oxide, zinc oxide, cobalt oxide, iron oxide, copper oxide, copper zinc oxide, ruthenium oxide, tungsten oxide, aluminum phosphate, vanadium oxide, vanadium molybdenum oxide, zirconium oxide, vanadium oxide, cerium oxide, and manganese oxide. In some embodiments, the metal oxide or mixed metal oxide includes one or more of aluminum oxide, titanium oxide, zinc oxide, cobalt oxide, iron oxide, copper zinc oxide, vanadium oxide, ruthenium oxide, and tungsten oxide. In some embodiments, the metal or mixture of metals includes one or more of Ru, Pt, Cu, Pd, Ni, Ag. Au, Fe, Co, Ir, and Mo. In some embodiments, the metal or mixture of metals includes one or more of Ru, Pt. Cu, Pd, Ni, and Ag In some embodiments, the metal dichalcogenides includes one or more of $MoS_2$, $WSe_2$, $MoSe_2$, and $WS_2$.

In some embodiments, the catalyst material 108 is in the form of a continuous film, single atoms, nanoclusters, clusters, a two-dimensional material, or discontinuous film. As used herein, a "continuous film" refers to a catalyst material with little spacing between atoms, nanoclusters, clusters, etc., such as less than about 1 nm spacing, or less than about 0.5 nm spacing. As used herein, a "discontinuous film" refers to a catalyst material with large spacing between atoms, clusters, nanoclusters, etc., such as at least about 1 nm spacing, or at least about 2 nm spacing. For example, FIG. 1 depicts an "active sites" layer 108 representing the catalyst material. The catalyst material in FIG. 1 shows a continuous film catalyst material 108. In one alternative, FIG. 2 depicts an "active sites" layer representing the catalyst material 208 that is a discontinuous film. In some embodiments, the catalyst material 108 or 208 has a thickness of about 70 pm to about 100 nm.

In some embodiments, the catalytic device includes an active layer that includes a catalyst material 108 or 208 (i.e., the active site) and an electrically conductive carbon material 106.

In some embodiments, the catalytic device includes a substrate 102 including an electrically conductive layer, a high-k dielectric material 104, an electrically conductive carbon material 106, and a continuous material 108 comprising the active site for adsorption and/or catalysis in electrical contact with the carbon layer, as depicted in FIG. 1. The applied electrical potential bias 110, $V_{CAT}$, connects at the substrate 102 and the active layer (the carbon layer 106 or active site layer 108 or both). Charge applied to the active layer moves laterally across the device through the carbon material 106 and/or the active site material 108 and then from the carbon material 106 into the active site material 108.

In some embodiments, as depicted in FIG. 2, the catalytic device 200 includes a substrate 102, high-k dielectric material 104, an electrically conductive carbon material 106, and a discontinuous material 208 including the active site for adsorption and/or catalysis in electrical contact with the carbon layer 106. The applied electrical potential bias 110, $V_{CAT}$, connects at the substrate 102 and the active layer (the carbon layer 108 or active site layer 208 or both). Charge applied to the active layer moves laterally across the device through the carbon material 106 and then from the carbon material 106 into the active site material 108.

Figure 3A:
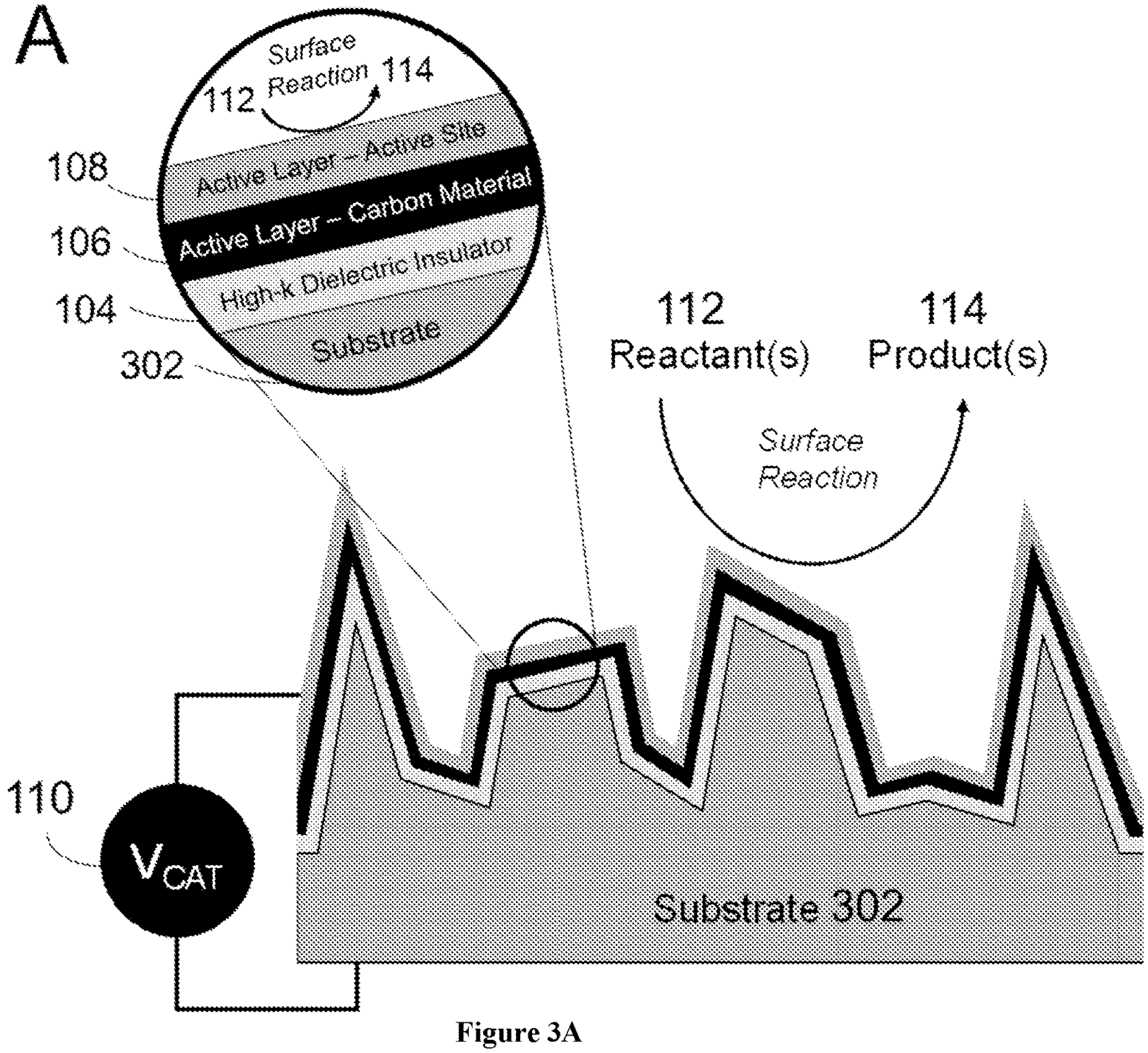
FIG. 3A depicts an example of a catalytic device as disclosed herein with a continuous catalyst material layer on a rough, high surface area electrically conductive layer (e.g., the substrate).
Figure 3B:
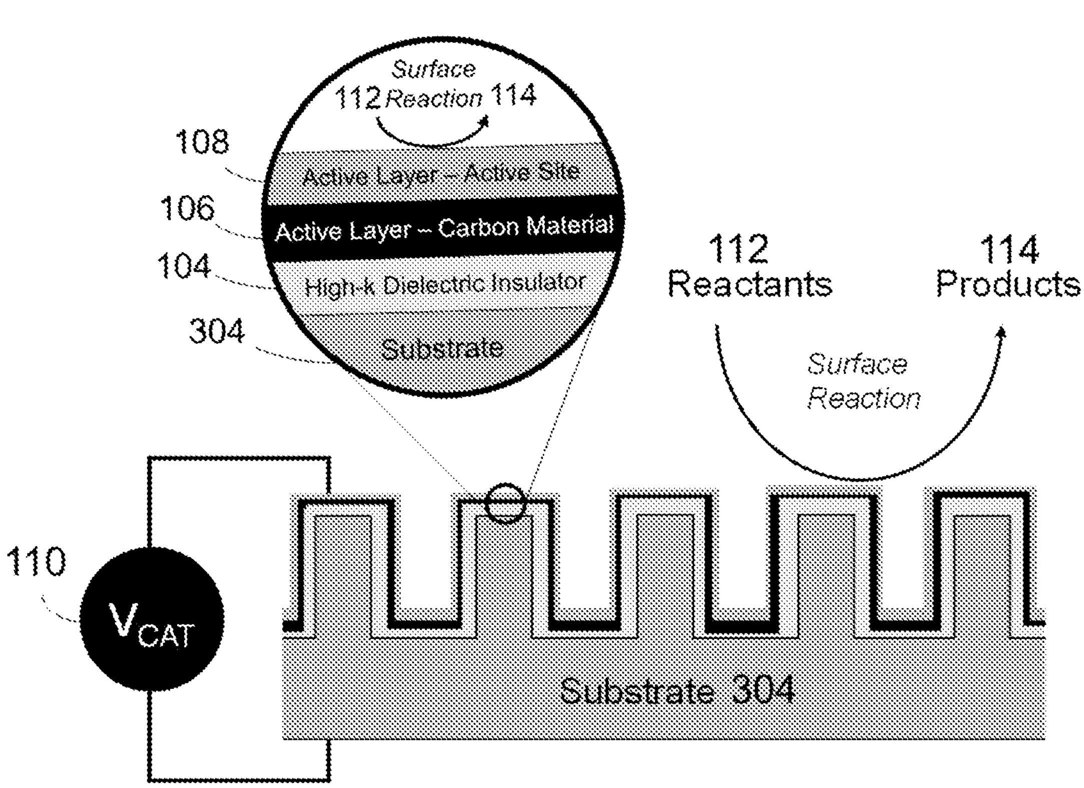
FIG. 3B depicts an example of a catalytic device as disclosed herein with a continuous catalyst material layer on a patterned, high surface area electrically conductive layer (e.g., the substrate).
Figure 4A:
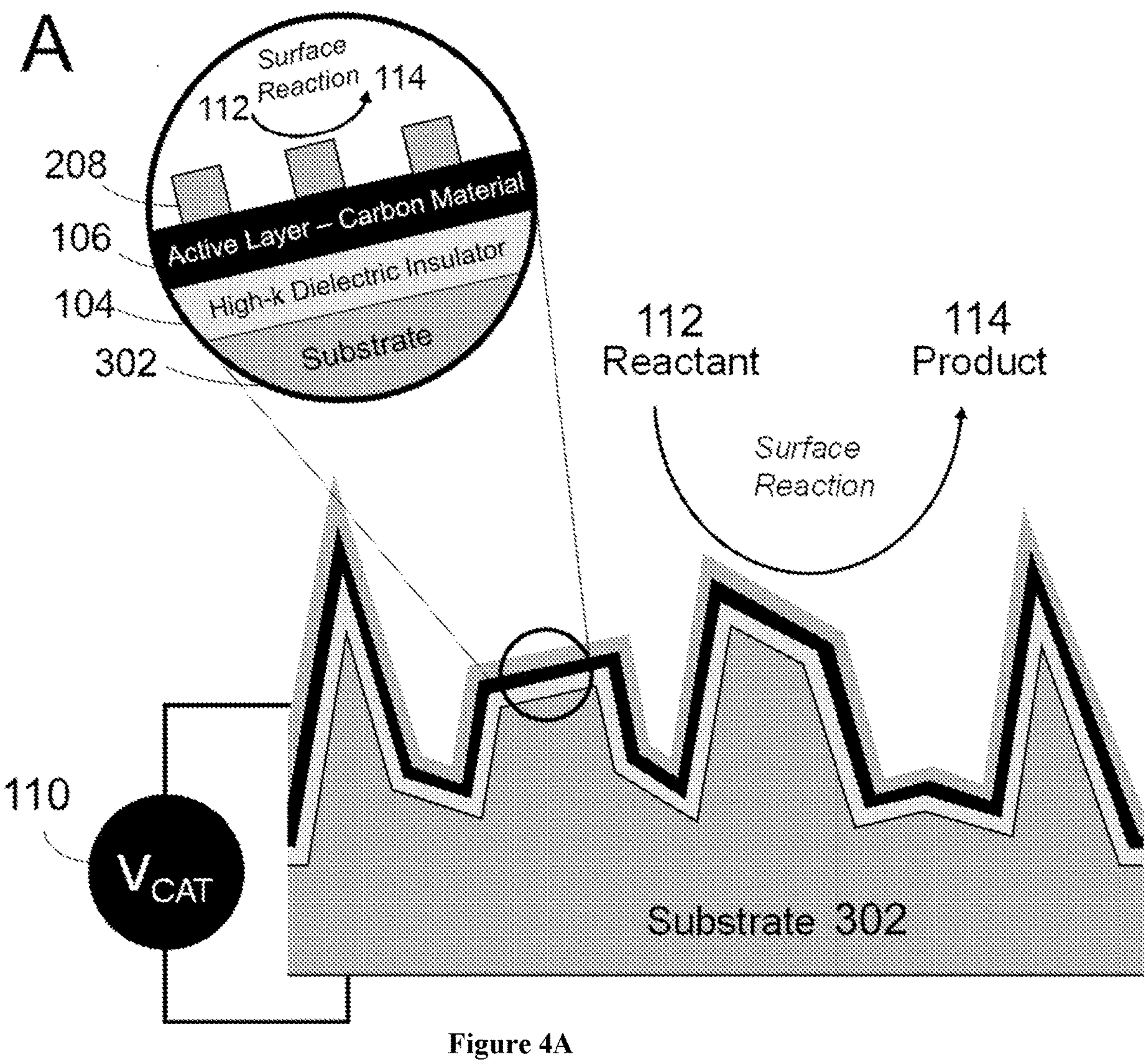
FIG. 4A depicts an example of a catalytic device as disclosed herein with a discontinuous catalyst material layer on a rough, high surface area electrically conductive layer (e.g., the substrate).
Figure 4B:
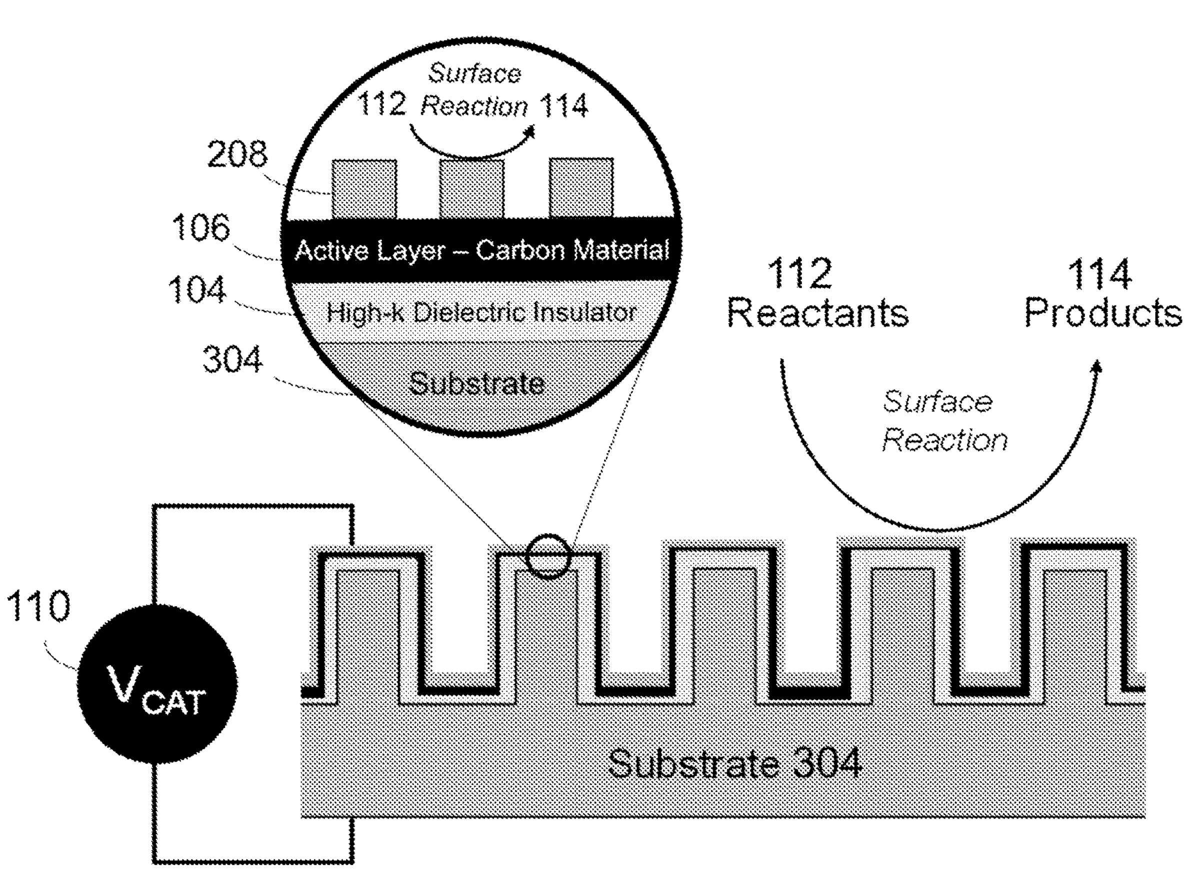
FIG. 4B depicts an example of a catalytic device as disclosed herein with a discontinuous catalyst material layer on a patterned, high surface area electrically conductive layer (e.g., the substrate).

Catalytic devices such as catalytic devises 100 and 200 depicted in FIGS. 1 and 2 allow for metal and/or metal oxide thermocatalytic active surfaces that can also be used for on/off adsorption control for gas separations. Molecules in a fluid phase above the active layer can interact, adsorb, desorb, and react on the carbon and active site material. Design of the catalytic capacitor also accounts for a microscopic surface that enhances surface area as depicted in FIG. 3A and FIG. 3B (for a continuous active layer of catalyst material 108) and FIG. 4A and FIG. 4B (for a discontinuous layer of catalyst material 208). A microstructured electrically conductive layer (for example, substrate 302 or 304 in FIGS. 3 and 4) can include a rough surface or a structured material such as nanopillars, nanoparticles, nanocubes, nanopyramids, or other surface designs that increase surface area.

The catalytic device serves as an active surface for adsorbing molecules and reacting them to products. This occurs via the flow of fluids including gases, vapors, and/or liquids above the active layer in contact with the active site. The potential bias 110 ($V_{CAT}$) is then applied as depicted in FIG. 1-4 to change the catalytic activity in the active layer at the active site 108 or 208. Application of the potential bias 110 can be applied statically to achieve constant optimized catalytic performance. Alternatively, $V_{CAT}$ 110 can be applied as a waveform consisting of oscillations in the form of sinusoidal, square, trigonal, or sawtooth wave, or combinations thereof, with the goal of improving catalytic rate at resonance conditions. Optimization of the applied $V_{CAT}$ dynamic waveform can also be optimized to control the extent of conversion of the surface reaction or selectivity to products.

In some embodiments, the catalyst material of the disclosure (for example, catalyst material 108 or 208) comprises clusters or single atoms of metals as well as clusters and thin films of metal oxides, e.g., titania, zinc oxide, and alumina. In one example, an alumina surface contains solid acid active sites for chemical reactions and chemisorption.

Also provided herein are methods of catalyzing one or more chemical reactions. For example, methods of catalyzing a conversion of one or more chemical reactants 112 to one or more chemical products 114. In some embodiments, the method includes contacting the catalyst material 108 or 208 of the catalytic device as disclosed herein (for example, catalytic device 100 or 200) with one or more chemical reactants 112; and applying a bias voltage 110 to the catalyst material to yield the one or more chemical products 114. In some embodiments, the one or more chemical reactants 112 are in the form of one or more of flow gases, vapors, and liquids. The one or more chemical reactants 112 are contacted with the catalyst material 108 or 208 to allow a reaction to occur. In some embodiments, the bias voltage 110 can be applied to the catalyst device as depicted in FIGS. 1-4. In some embodiments, the bias voltage includes being applied in a range of −100 V to +100V. In some embodiments, the bias voltage includes being applied statically (e.g., a fixed voltage over time) or dynamically (e.g., not a fixed voltage over time). In some embodiments, when the bias voltage includes being applied dynamically, the frequency range includes a range of 0.01 Hz to 100 MHz. In some embodiments, when the bias voltage includes being applied dynamically, the amplitude includes a range of bias voltage in a range of −100 V to +100V. In some embodiments, when the bias voltage includes being applied dynamically, the shape of the dynamic bias voltage includes sinusoidal, square, trigonal, sawtooth waveform, or combinations thereof.

In some embodiments, the conversion of one or more chemical reactants 112 to one or more chemical products 114 includes synthesis of ammonia, synthesis of carbon dioxide, synthesis of methanol, synthesis of ethanol, synthesis of carbon monoxide, reduction of NOX, oxidation of ethylene to ethylene oxide, dehydrogenation of ethane to ethylene, dehydrogenation of propane to propylene, dehydrogenation of butane to butenes, butadiene, or both, partial oxidation of methane to methanol, or oxidation of propylene to propylene oxide, reduction of carbon dioxide, and conversion of carbon dioxide to methanol. In some embodiments, the one or more chemical reactants 112 are reduced, oxidized, combined, condensed, decomposed, hydrogenated, deoxygenated, desulfurized, reformed, or dehydrated by the catalytic device. In some embodiments, the one or more reactants 112 include one or more of a nitro compound, ethylene, ethane, propane, butane, methane, propylene, and carbon dioxide. In some embodiments, the one or more chemical products 114 include one or more of hydrogen peroxide, oxygen ($O_2$), hydrogen ($H_2$), ammonia, carbon dioxide, methanol, ethanol, carbon monoxide, an amine, dimethyl ether, ethylene oxide, ethylene, propylene, butene, butadiene, propylene oxide, and carbon monoxide.

Also provided herein are methods of fabricating a catalytic device. In some embodiments, the method includes disposing a dielectric layer 104 as disclosed herein on an electrically conductive layer as disclosed herein (for example, substrate 102, 302, or 304); disposing an electrically conductive carbon material 106 on the dielectric layer 104; disposing a catalyst material (for example, catalyst material 108 or 208) on the electrically conductive carbon material 106, the dielectric layer 104, or both; and electrically coupling the electrically conductive layer and the catalyst material.

In some embodiments, methods of disposing the dielectric layer 104 on the electrically conductive layer include atomic layer deposition (ALD), sputtering, deposition from a solvent, epitaxial growth, or the like. For example, disposing the dielectric layer 104 on the substrate 102 can include exposing a conductive substrate material to a first gaseous inorganic precursor via atomic layer deposition to form the dielectric layer on the electrically conductive layer.

In some embodiments, disposing the electrically conductive carbon material 106 on the dielectric layer 104 includes chemical vapor deposition or the like. For example, disposing the electrically conductive carbon material 106 on the dielectric layer 104 can include transferring the electrically conductive carbon material to the dielectric layer to form a layer of the electrically conductive carbon material on the dielectric layer. In some embodiments, transferring the electrically conductive carbon material to the dielectric layer to form a layer of the electrically conductive carbon material on the dielectric layer comprises exposing the dielectric layer to a first carbon material precursor, made via chemical vapor deposition.

In some embodiments, disposing the catalyst material 108 or 208 on the electrically conductive carbon material 106, the dielectric layer 104, or both includes atomic layer deposition (ALD), sputtering, deposition from a solvent, epitaxial growth, solution-based incipient wetness impregnation, or the like. For example, disposing the catalyst material on the electrically conductive carbon material, the dielectric layer, or both can include exposing the dielectric layer, the electrically conductive carbon material, or both to a second gaseous inorganic precursor via atomic layer deposition or via solution-based incipient wetness impregnation.

EXAMPLES

Example 1: Alumina/Graphene/$HfO_2$/Si Catalytic Device

Figures 5A, 5B:
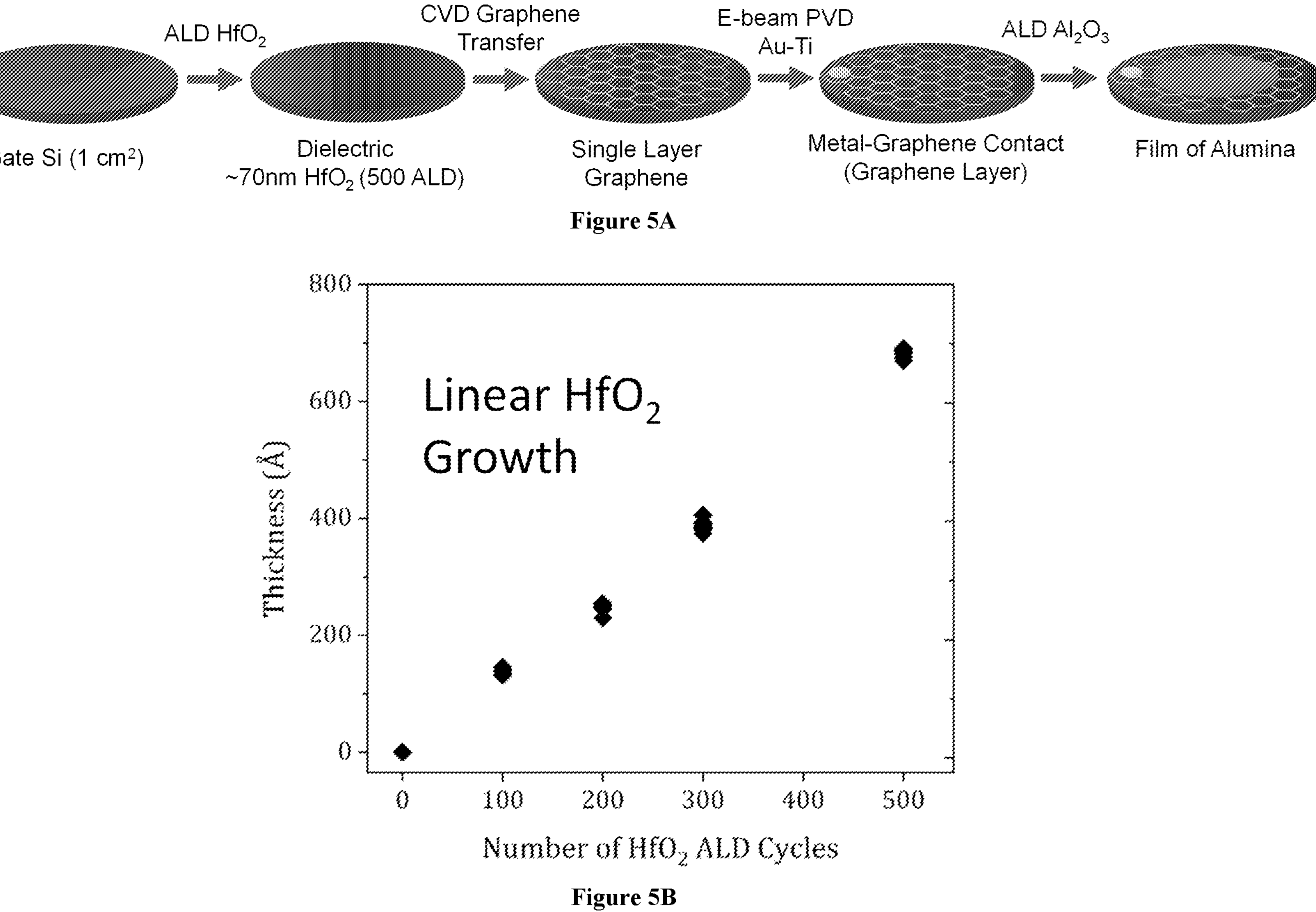
FIG. 5A depicts an example of a total fabrication process of an alumina-graphene catalytic device as disclosed herein.
FIG. 5B is a graph of the $HfO_2$ growth process by atomic layer deposition (ALD) with tetrakis-(dimethylamino) hafnium (TDMAH) in the fabrication of the catalytic devices disclosed herein.

The catalytic capacitor device was fabricated on a 525±25 μm thick silicon wafer (WaferPro, Item #C04014, single side polished, B-doped) of 100 mm in diameter. The total catalytic device synthesis included several steps depicted in FIG. 5A. Starting from the conductive silicon wafer, a layer of amorphous $HfO_2$ was deposited via atomic layer deposition (FIG. 5B). A film of $HfO_2$ was grown at 100° C. with each $HfO_2$ ALD cycle including alternating exposures to 200 ms pulses of water oxidant and 13 ms pulses of Tetrakis (dimethylamino)Hafnium (TDMAH) (Sigma-Aldrich, CAS Number: 19782-68-4) in a Lesker ALD-150 LE. This achieved a linear $HfO_2$ film growth (FIG. 5B): the resulting film grown by 500 $HfO_2$ ALD cycles on the device was 70 nm thick.

Figure 5C:
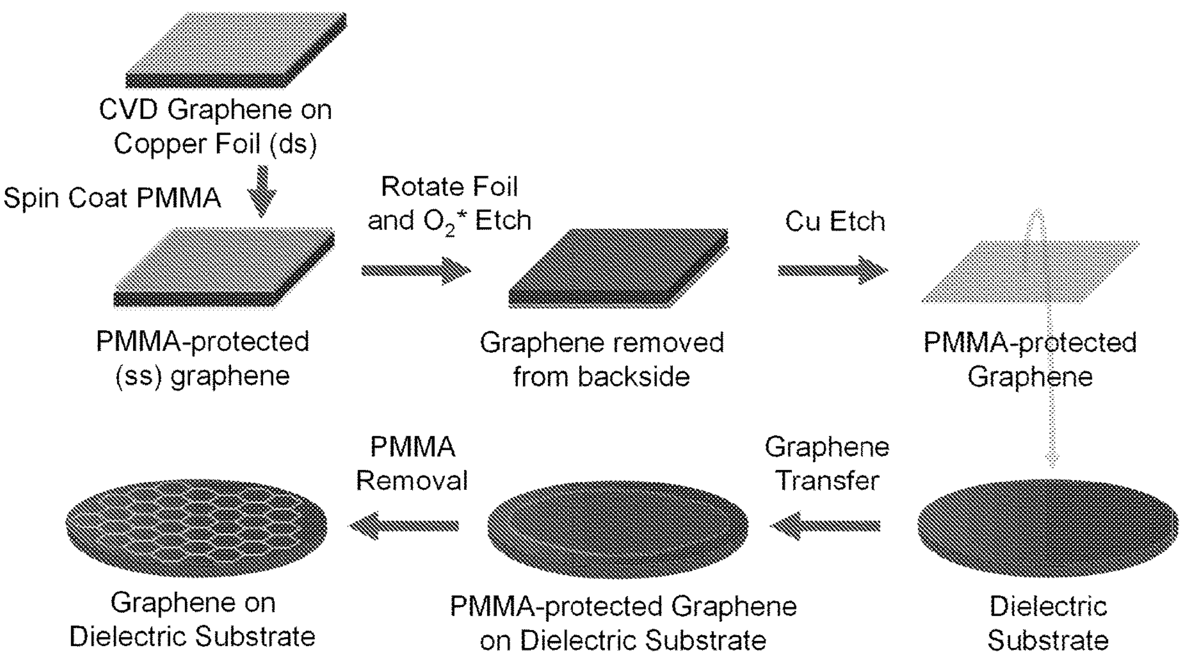
FIG. 5C depicts an example of a graphene transfer process from a copper foil to an example of a catalytic device as disclosed herein.
Figure 6A:
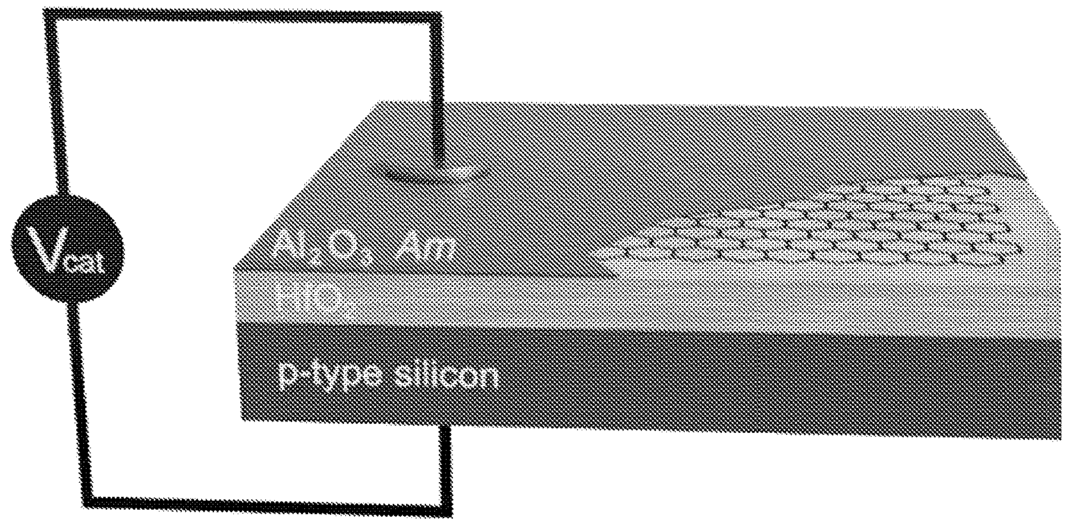
FIG. 6A is an illustration of an alumina-graphene catalytic device as disclosed herein.
Figure 6B:
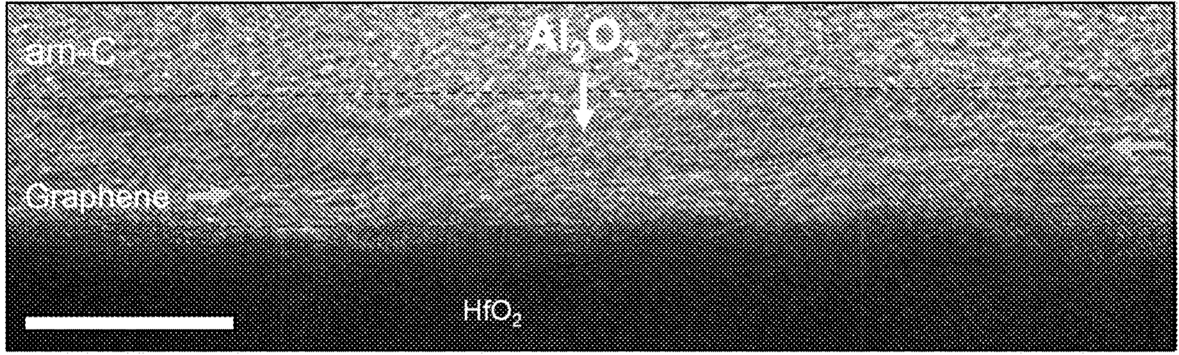
FIG. 6B is a bright-field transmission electron microscopy (TEM) image of a cross-sectional of an embodiment of the catalytic device as disclosed herein showing the $HfO_2$, graphene and am-$Al_2O_3$. The dashed line shows the boundary between am-$Al_2O_3$ and deposited protective am-C layer. The scale bar is 5 nm.
Figure 6C:
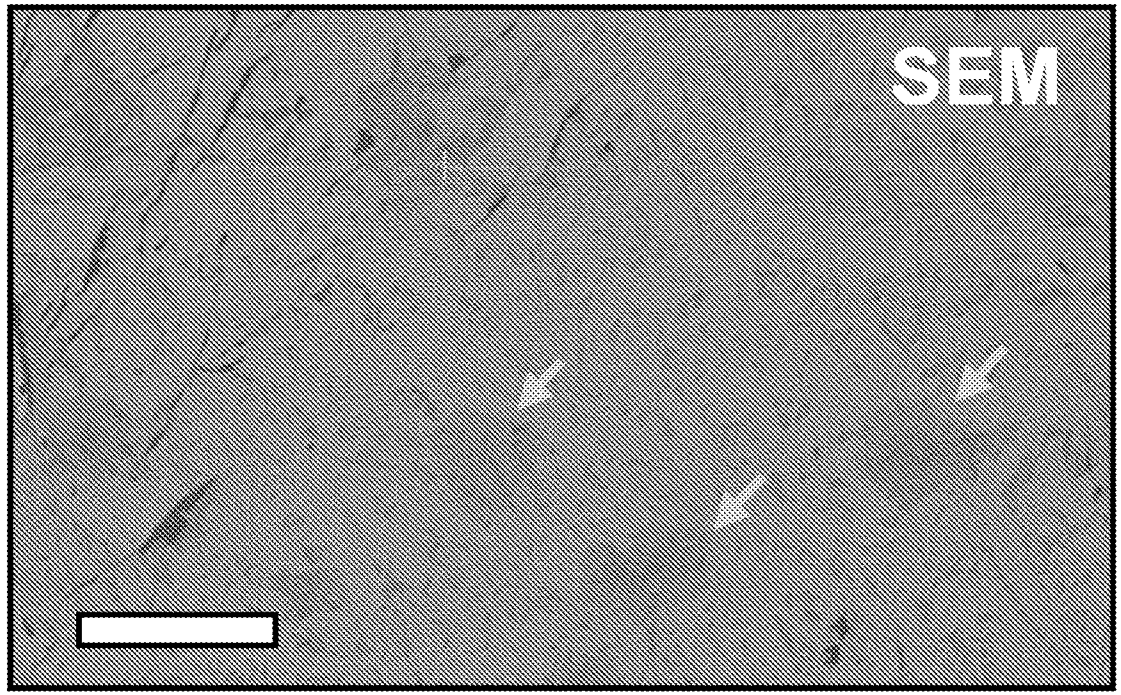
FIG. 6C is a top-view scanning electron microscopy (SEM) image of an embodiment of the catalytic devices disclosed second herein. The arrows show the hexagon-shape nucleated second layers of graphene. The scale bar is 25 μm.
Figure 6D:
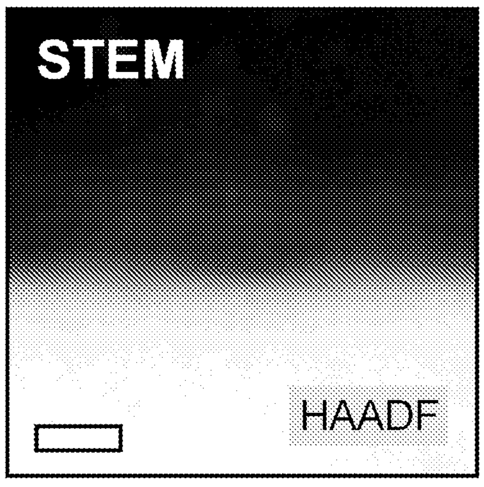
FIG. 6D is a high-angle annular dark-field scanning transmission electron microscopy (HAADF-STEM) image of an embodiment of a catalytic device disclosed herein.
Figure 6E:
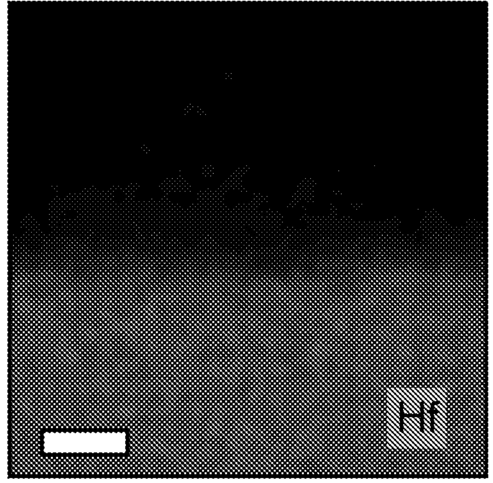
FIG. 6E is a complimentary scanning transmission electron microscopy-energy-dispersive X-ray spectrometry (EDX) image of the Hf in an embodiment of a catalytic device disclosed herein.
Figure 6F:
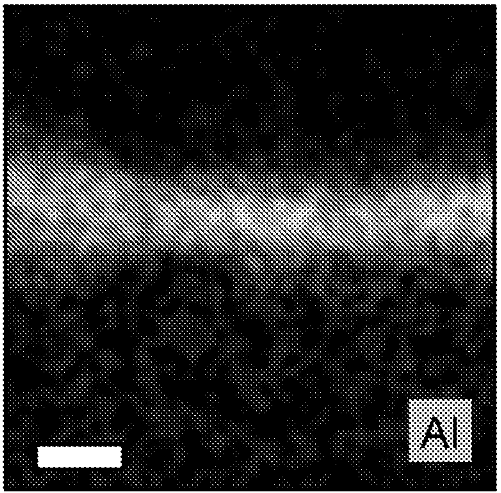
FIG. 6F is a complimentary EDX image of the Al in an embodiment of a catalytic device disclosed herein.
Figure 6G:
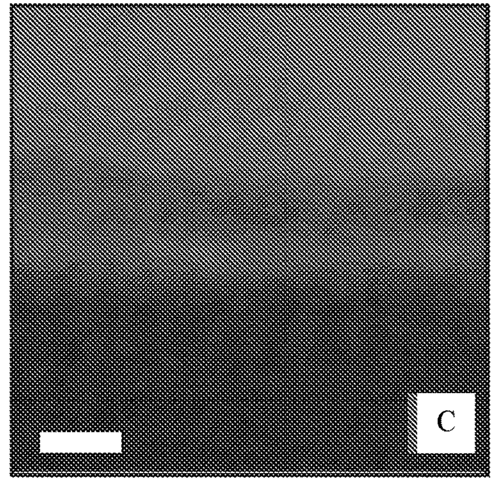
FIG. 6G is a complimentary EDX image of the carbon in an embodiment of a catalytic device disclosed herein.
Figure 6H:
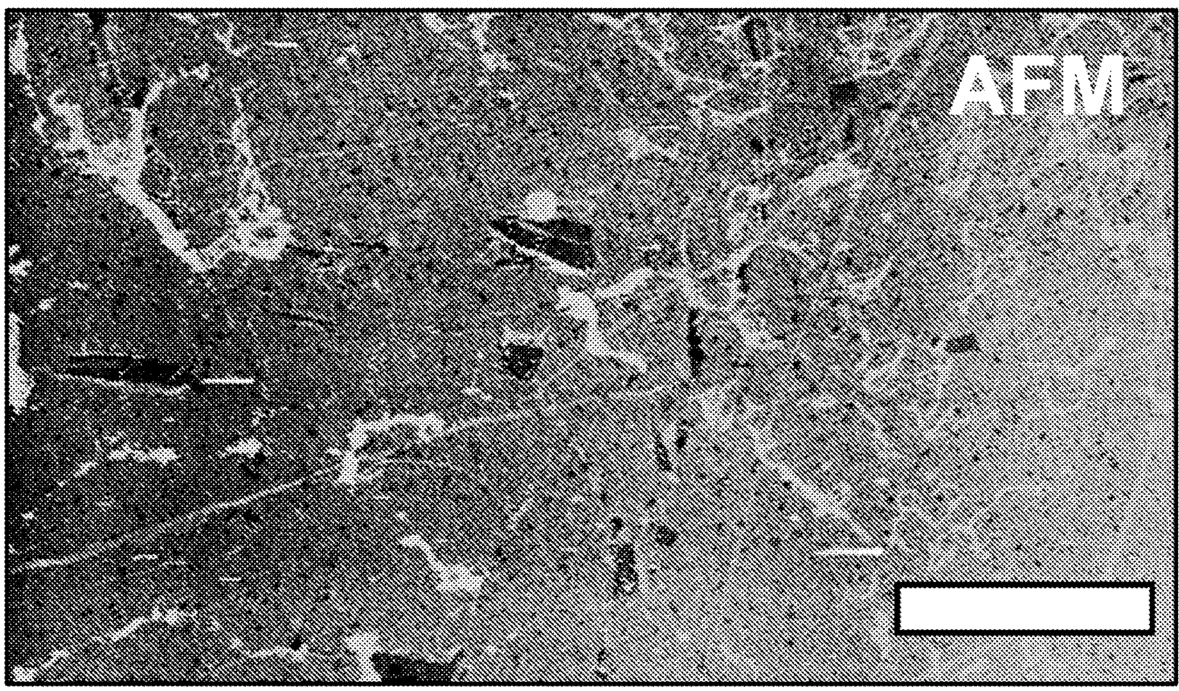
FIG. 6H is an atomic force microscopy (AFM) scan of an embodiment of a catalytic device disclosed herein.
Figure 6I:
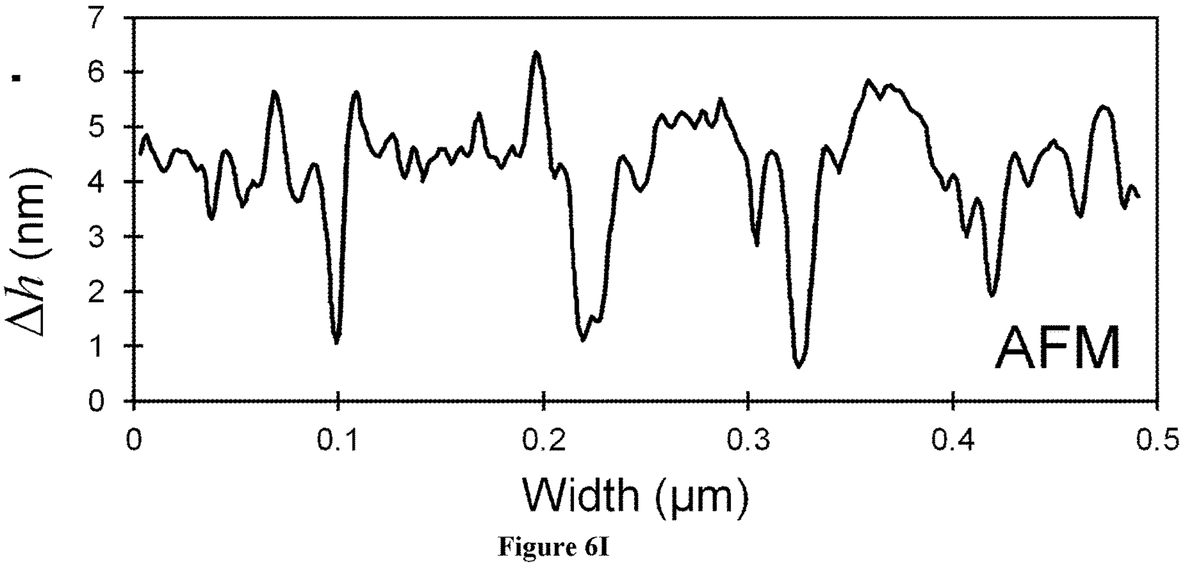
FIG. 6I is an AFM profile of an embodiment of a catalytic device disclosed herein.
Figure 6J:
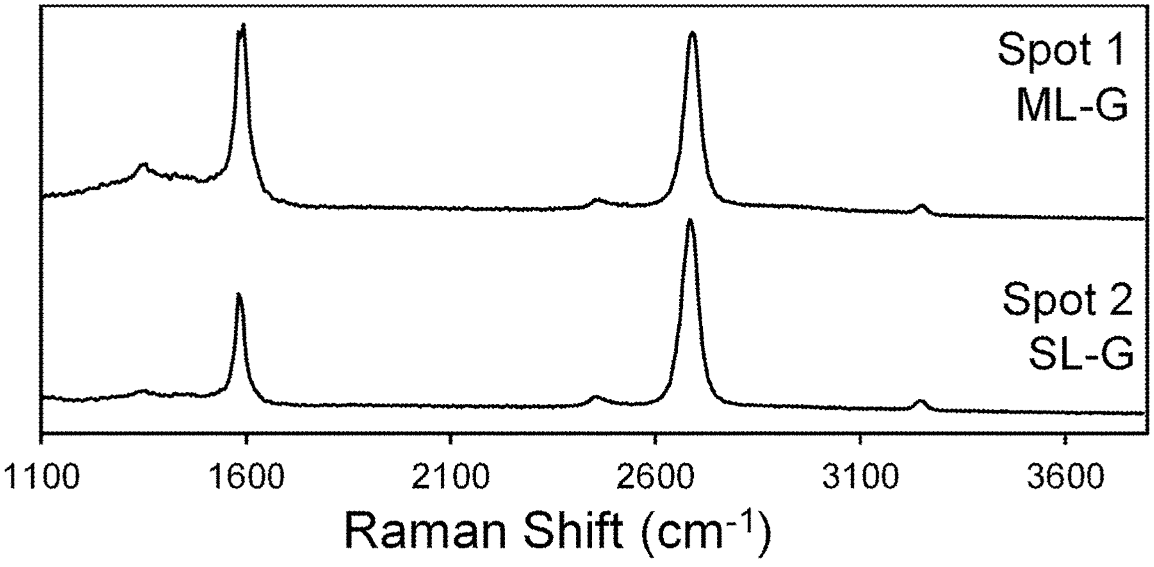
FIG. 6J is a Raman spectra of an embodiment of a catalytic device disclosed herein across two spots of the catalytic device.
Figure 7A:
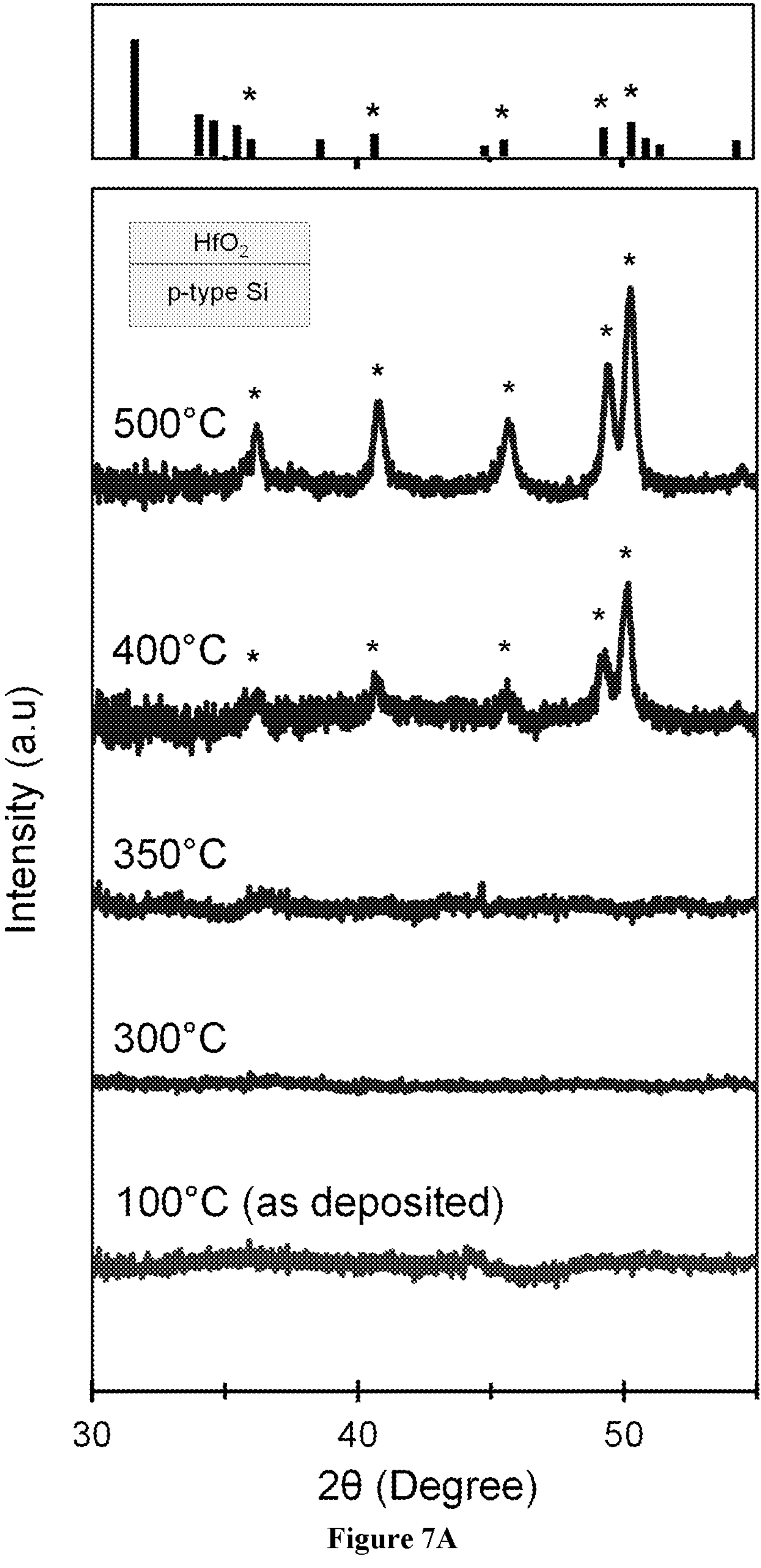
FIG. 7A are X-ray diffraction patterns of atomic layer deposited-$HfO_2$ on a silicon electrically conductive layer (e.g., the substrate) of an embodiment of a catalytic device disclosed herein after heating in air at various temperatures. Peaks associated with crystallized monoclinic $HfO_2$ are shown as reference.
Figure 7B:
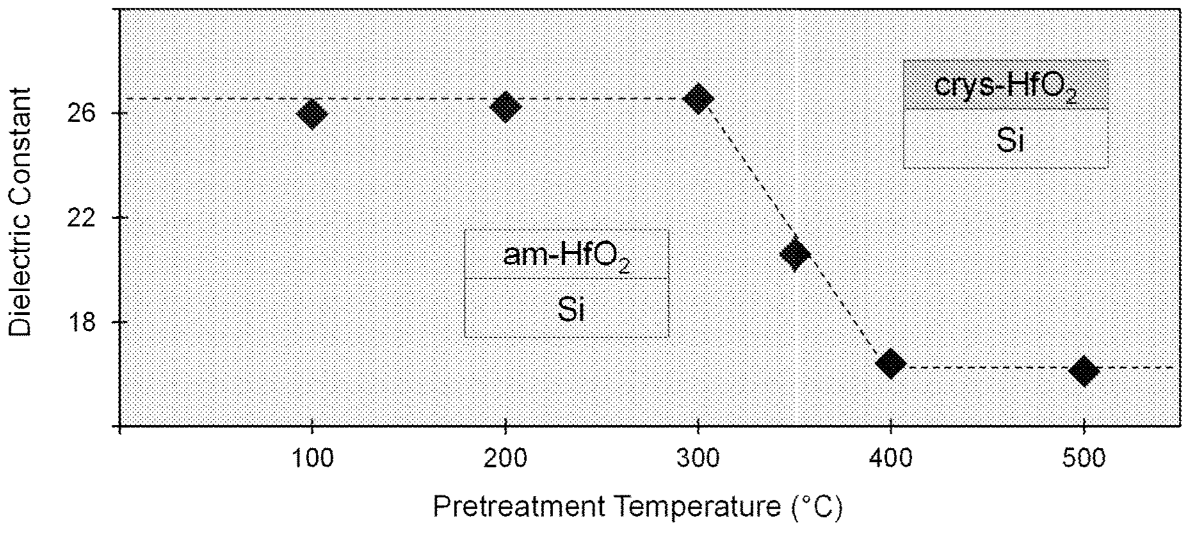
FIG. 7B is the averaged dielectric constant of $HfO_2$ of an embodiment of a catalytic device as disclosed herein as a function of calcination temperature in air.
Figure 7C:
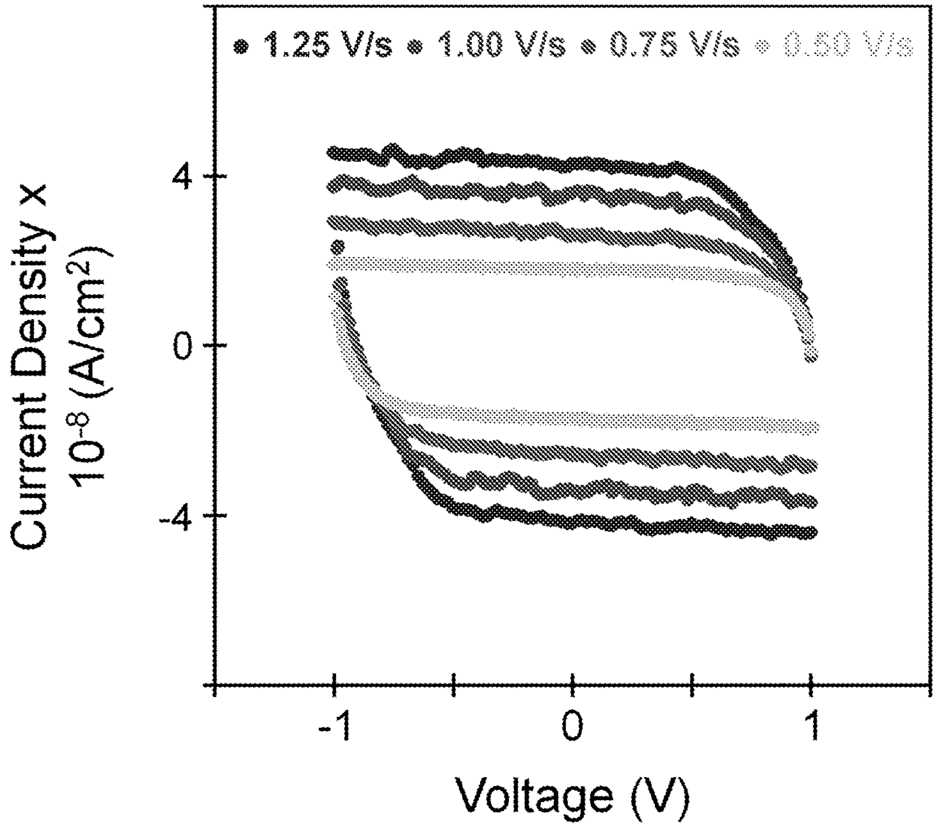
FIG. 7C is the capacitive current density of a graphene-$HfO_2$—Si embodiment of a catalytic device as disclosed herein as a function of voltage bias at different voltage sweep rates.
Figures 7D, 8A:
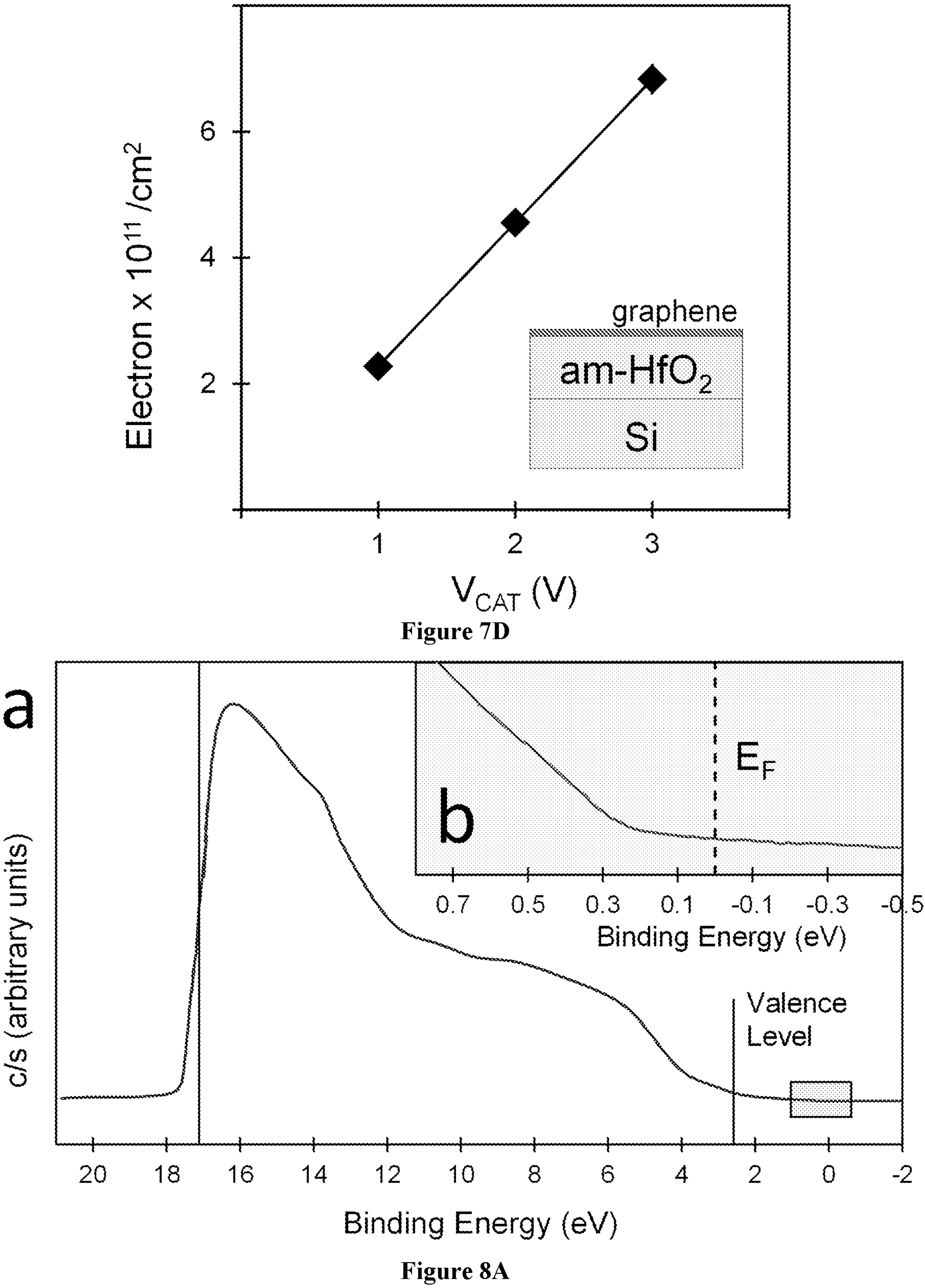
FIG. 7D is an averaged number of capacitive electrons of graphene in an embodiment of a catalytic device as disclosed herein as a function of $V_{CAT}$. The error bars are shown.
FIG. 8A is an ultraviolet photoelectron spectroscopy (UPS) of an alumina-graphene embodiment of a catalytic device as disclosed herein with energy cutoff for work function and valence band onset highlighted. An insulator-semiconductor transition near Fermi level shown in the inset.
Figures 8B, 8C:
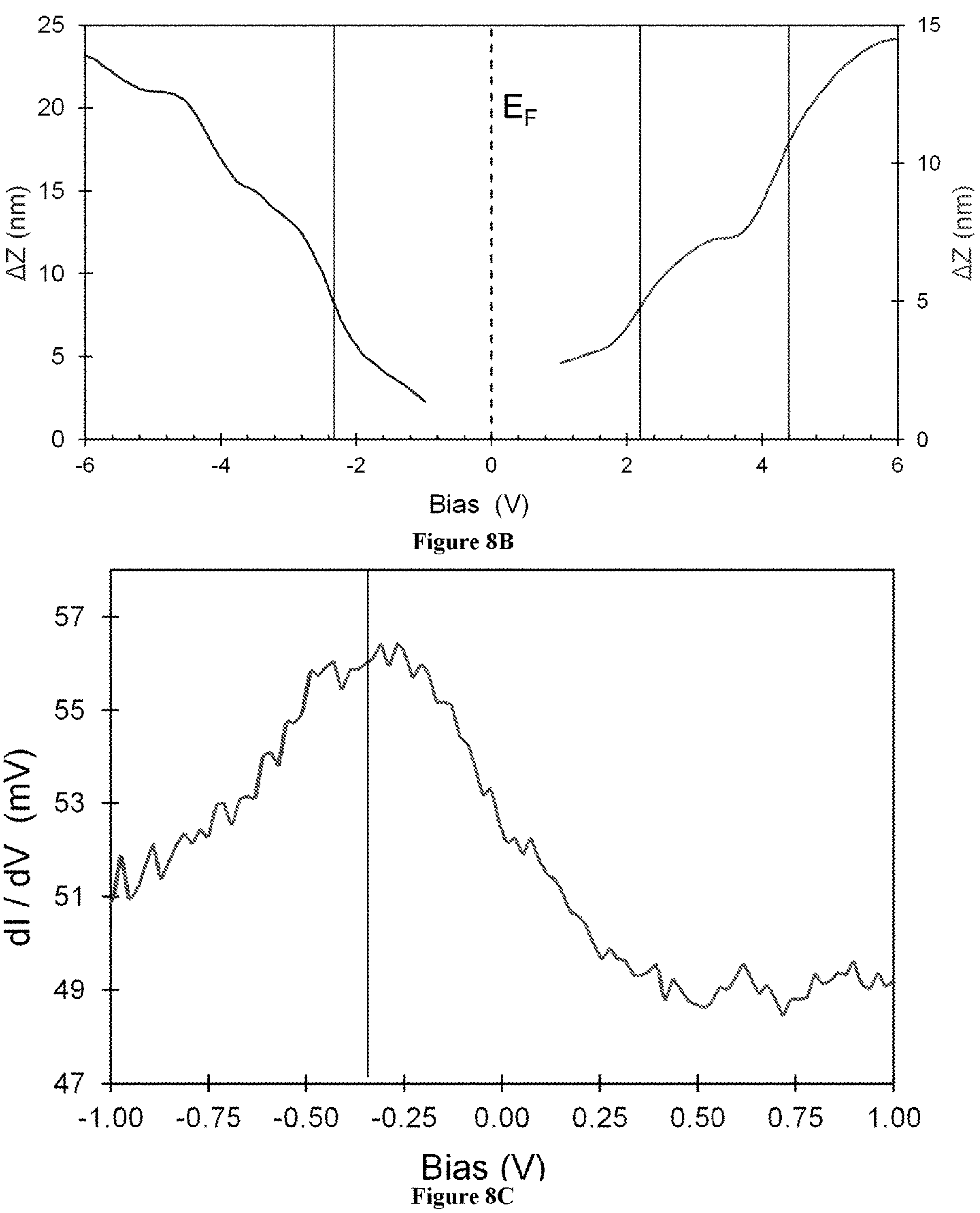
FIG. 8B are constant-current distance-voltage curves over the surface of an embodiment of a catalytic device disclosed herein.
FIG. 8C is a differential conductance graph near $E_F$ corresponding to discrete gap state of an embodiment of a catalytic device disclosed herein (500×500 $nm^2$).
Figure 8D:
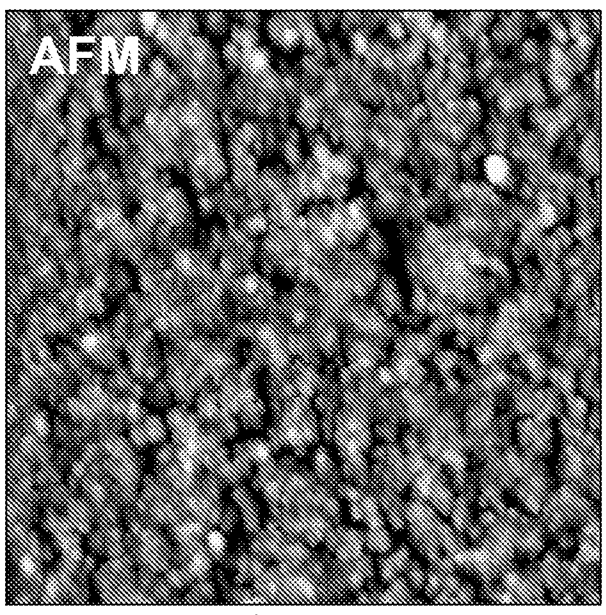
FIG. 8D is an AFM image of the surface of an embodiment of a catalytic device disclosed herein.
Figure 8E:
FIG. 8E is a scanning transmission microscopy image of the surface of an embodiment of a catalytic device disclosed herein.

Graphene was then transferred on top of the $HfO_2$ dielectric layer (FIG. 5C, FIG. 6A-6J). Graphene was purchased as a single layer on copper foil (Graphene Supermarket, SKU: CVD-Cu-2X2) and transferred in multiple steps to the $HfO_2$ device layer as depicted in FIG. 5C. The graphene on copper foil was first coated and protected in PMMA, followed by both an oxygen plasma etch and a copper removal, leaving the graphene on the PMMA. The PMMA/Graphene was scooped onto the $HfO_2$/Si substrate, where the PMMA was removed leaving behind the large sheet (~1 $cm^2$) single- and multi-layer graphene (FIG. 5C, FIG. 6B-6C). Both single and multi-layer graphene were observed by Raman spectroscopy (FIG. 6J).

A thin alumina film was then deposited on top of the graphene as the active catalytic layer. Grown by ALD using the precursor Trimethyl Aluminum (TMA), each deposition cycles utilize alternating pulses of water oxidant for 10 s and TMA for 12 ms at 100° C. For the ~5 nm layer grown in the TEM image of FIG. 6B, this thickness required 50 cycles, producing an even width amorphous alumina film across the entire catalytic device. The alumina layer, characterized by atomic force microscopy (AFM) in FIG. 6H, exhibits cracks with thickness of ~5 nm (FIG. 6I), consistent with the thickness of the alumina layer of ~5 nm.

The entire alumina-graphene catalytic device cross section was imaged in FIGS. 6B and 6D-6G. After applying an amorphous carbon layer to the top of the device (for the purpose of TEM imaging), the interface of $HfO_2$/graphene/$Al_2O_3$ became visible by electron microscopy. A layer of graphene can be observed between the $HfO_2$ and $Al_2O_3$ layers. The $HfO_2$ film exhibited amorphous structure when characterized by XRD when maintained below: 350° C., with dielectric constant of ~25 and ~16 for amorphous and crystalline layers, respectively (FIG. 7A-7D).

The alumina-graphene catalytic device exhibited unique electronic surface properties associated with its design and response to potential bias ($V_{CAT}$) as shown in FIGS. 8A-8E. Ultraviolet photoelectron spectroscopy measured electronic states within the alumina active layer only 0.25 eV below the Fermi level. A similar gap state was observed with a constant-current distance-voltage curve obtained via scanning tunneling electron microscopy (FIG. 8C), indicating the electronic response of the alumina-graphene catalytic capacitor to potential bias.

Example 2: Isopropanol Dehydration on Alumina/Graphene/$HfO_2$/Si Catalytic Device The gated metal and metal oxide film layers serve as catalytic sites for chemical conversion. For example, bound to the γ-$Al_2O_3$ active site via the hydroxyl oxygen, ethanol can undergo unimolecular dehydration to ethylene or water or bimolecular formation of diethyl ether and water (DeWilde et al., *ACS Catal.* 2013, 3 (4), 798-807). Formation of ethylene was shown by combined experiment and computation to derive from an E2-type dehydration mechanism involving the Lewis acid and base centers on the alumina catalyst; the acidic Al site extracts the OH group from the alcohol while the counter surface oxygen base interacts with the alcohol beta hydrogen (Roy et al., *ACS Catal.* 2012, 2 (9), 1846-1853).

In this example, isopropanol was dehydrated on the alumina/graphene/$HfO_2$/Si device of example 1 to produce propylene and water with varying catalytic performance for different applied bias potentials. The device of example 1 was loaded into a high vacuum chamber with electrical leads in contact with the alumina catalytic layer ($V_{CAT}$) as shown in FIG. 6A. The vacuum chamber was then pumped down to 10-3 Torr to evacuate air and moisture. Isopropanol was then dosed into the sample chamber, after which the chamber was pumped down to 10-9 Torr.

To initiate the reaction experiment as a temperature programmed surface reaction (TPSR), the gate voltage was applied to the catalytic device: in this case $V_{CAT}$=+2.0 V was applied to the catalyst surface relative to the silicon gate. The sample was then heated with a linear temperature ramp of 10 K $min^{-1}$ up to 350° C. During the temperature ramp, isopropanol both desorbed from the surface and formed propene and water via dehydration. These products were quantified via a mass spectrometer: propene was tracked via 41 M/z after which the baseline was subtracted.

Figure 9:
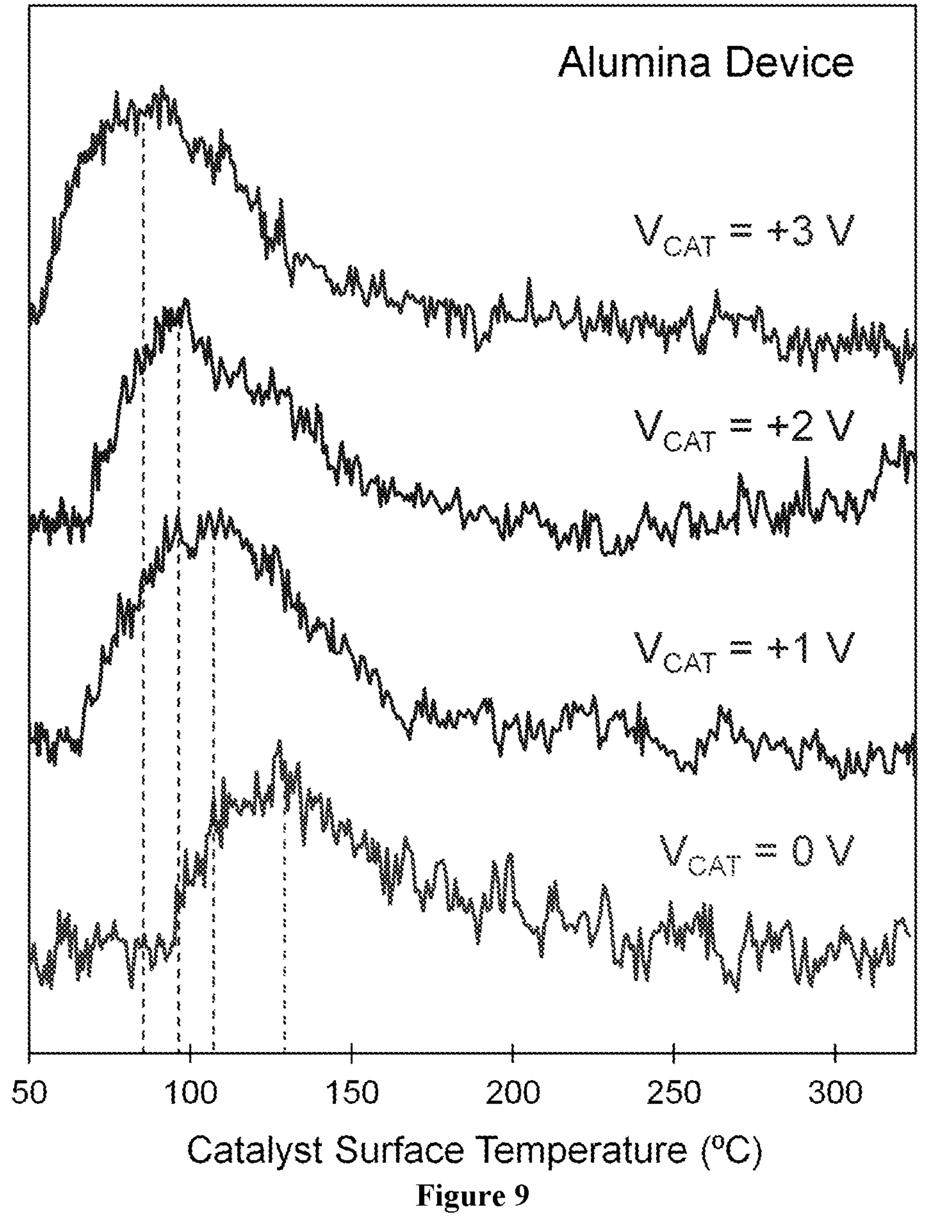
FIG. 9 is a graph of a temperature-programmed surface reaction of isopropanol dehydration using an embodiment of a catalytic device disclosed herein. The temperature programmed isopropanol dehydration occurred on an alumina catalytic device (70 nm $HfO_2$, graphene, ~5 nm alumina) to form propene at varying catalytic voltages.

As shown in FIG. 9, the peak position of propylene formation from isopropanol on the alumina/graphene/$HfO_2$/Si catalytic device moved by ~50 degrees to lower temperature as the applied bias increased from $V_{CAT}$ of 0 volts to +3 volts. This indicated a substantial increase in the acidity of the catalytic capacitor with a reduction of the activation energy of reaction of ~20 KJ $mol^{-1}$. The catalyst device exhibited tunable solid Lewis acidity as a function of the applied bias.

Example 3: Titania/Graphene/$SiO_2$/Si Catalytic Device

The $TiO_2$-based catalytic device was synthesized on a 525±25 μm thick, 100 mm diameter p-type Si wafer with 100±5 nm thick thermal oxide (Silicon Valley Microelectronics, single-side polished, Si resistivity 0.005-0.01 Ohm-cm). For this device, the doped Si wafer acts as the gate, while the native oxide ($SiO_2$) is used as the dielectric layer (k~3.9). Prior to fabrication, the wafer was cleaned via solvent rinse in acetone, methanol, then isopropanol (full sequence repeated twice, drying with pressurized $N_2$ between sequences), followed by rinsing in deionized water and drying with $N_2$. After cleaving the wafer into ca. 1×1 cm pieces, the full device was fabricated on each piece via the following procedures.

First, graphene was transferred on top of the $SiO_2$ layer following the procedures described in Example 1 (see FIG. 5C). Next, the top-side electrode was deposited via E-beam evaporation within a Temescal evaporator at a deposition pressure at or below $4\times10^{-6}$ Torr. The electrode composition is 30 nm Au deposited on top of 5 nm Ti: both metals are evaporated at a rate of 1 Å/s with a 5-minute wait period between layers to prevent equipment damage. A custom-made steel stencil mask is used to pattern the electrode.

The catalytic $TiO_2$ layer is then deposited via ALD within a Kurt J Lesker ALD-150LE. Tetrakis(dimethylamido)titanium (IV) (Sigma Aldrich product no. 469858) and water are used as the Ti metal source and oxidizer, respectively. Deposition is carried out at 200° C. with a growth rate of ~0.05 nm/cycle: 100 cycles are used to deposit a 5 nm thick $TiO_2$ layer. The entire device is annealed at 400° C. for 30 minutes in an ultrapure air environment within a tubular furnace (Lindberg/Blue M model no. TF55035A-1). Finally, a 5×5 mm area on the back side of the Si wafer is scratched with a diamond-tip scribe to remove any thermal oxide and expose the doped Si wafer to improve electrical contact, leading to the complete catalytic device.

Example 4: ZnO/Graphene/$HfO_2$/Si Catalytic Device

The ZnO-based catalytic capacitor was fabricated on a 525±25 μm thick silicon wafer (WaferPro, Item #C04014, single side polished, B-doped) of 100 mm in diameter. Prior to fabrication, the wafer was cleaned via solvent rinse with acetone, methanol, isopropanol followed by drying with pressurized $N_2$ (full sequence repeated thrice). After cleaving the wafer into ca. 1×1 cm pieces, the full device was fabricated on each piece via the following procedures.

Starting from the conductive silicon wafer, a layer of amorphous $HfO_2$ was deposited via atomic layer deposition (FIGS. 5A and 5B). A film of $HfO_2$ was grown at 100° C. with each $HfO_2$ ALD cycle including of alternating exposures to 200 ms pulses of water oxidant and 13 ms pulses of Tetrakis(dimethylamino)Hafnium (TDMAH) (Sigma-Aldrich, CAS Number: 19782-68-4) in a Kurt J Lesker ALD-150 LE with an ozone co-feed option. This achieved a linear $HfO_2$ film growth: the resulting film grown by 500 $HfO_2$ ALD cycles on the device was 70 nm thick.

Graphene, purchased as a single layer on copper foil (Graphene Supermarket, SKU: CVD-Cu-2X2), was then transferred on top of the $HfO_2$ dielectric layer, with the procedure as described in Example 1 (see FIG. 5C). The graphene on copper foil was first coated and protected in PMMA followed by both an oxygen etch and a copper removal, leaving the graphene on the PMMA. The PMMA/Graphene was then scooped onto the $HfO_2$/Si substrate, where the PMMA was removed leaving behind the large sheet (~1 $cm^2$) single- and multi-layer graphene (FIG. 5C and FIG. 6C). Both single and multi-layer graphene were observed by Raman spectroscopy (FIG. 6J).

The catalytic ZnO layer was then deposited via ALD within a Kurt J Lesker ALD-150 LE. A film of ZnO was grown at 250° C. with each ALD cycle including of alternating exposures to 20 ms pulses of water oxidant and 20 ms pulses of Diethylzinc (DEZ) (Sigma-Aldrich, Product Number: 668729). The resulting film thickness grown by 50 ZnO ALD cycles on the device was 5 nm thick.

Example 5: Pt/Graphene/$HfO_2$/Si Catalytic Device

The Pt-based catalytic device is fabricated on a 525±25 μm thick silicon wafer (WaferPro, Item #C04014, single side polished, B-doped) of 100 mm in diameter. Prior to fabrication, the wafer is cleaned via solvent rinse with acetone, methanol, isopropanol followed by drying with pressurized $N_2$ (full sequence repeated thrice). After cleaving the wafer into ca. 1×1 cm pieces, the full device is fabricated on each piece via the following procedures.

Starting from the conductive silicon wafer, a layer of amorphous $HfO_2$ is deposited via atomic layer deposition (FIG. 5B). Using Tetrakis(dimethylamino)Hafnium (TDMAH) (Sigma-Aldrich, CAS Number: 19782-68-4), a film of $HfO_2$ is grown at 100° C. with 200 ms pulses of water oxidant and 13 ms pulses of TDMAH in a Lesker ALD-150 LE with ozone co-feed option. This achieves a linear $HfO_2$ film growth: the resulting film grown by 500 $HfO_2$ ALD cycles on the device is 70 nm thick.

Graphene, purchased as a single layer on copper foil (Graphene Supermarket, SKU: CVD-Cu-2X2), is then transferred on top of the $HfO_2$ dielectric layer, with the procedure as described in Example 1 (see FIG. 5C). The graphene on copper foil is first coated and protected in PMMA followed by both an oxygen plasma etch and a copper removal, leaving the graphene on the PMMA. The PMMA/Graphene is then scooped onto the $HfO_2$/Si substrate (see photo), where the PMMA is removed leaving behind the large sheet (~1 $cm^2$) single- and multi-layer graphene (FIG. 5C, FIG. 6C). Both single and multi-layer graphene are observed by Raman spectroscopy (FIG. 6J).

Platinum (Pt) particles are deposited on top of the graphene as the active catalytic layer. Each Pt ALD cycle includes a one second dose of precursor (Methylcyclopentadienyl)-trimethyl platinum (MeCpPtMe3) and a five second dose oxygen at 250° C. Pt particles are grown after 50 Pt ALD cycles.

Example 6: Copper/Graphene/$SiO_2$/Si Catalytic Device

The Cu-based catalytic capacitor device is fabricated on a 525±25 μm thick silicon wafer (WaferPro, Item #C04014, single side polished, B-doped) of 100 mm in diameter. Prior to fabrication, the wafer is cleaned via solvent rinse with acetone, methanol, isopropanol followed by drying with pressurized $N_2$ (full sequence repeated thrice). After cleaving the wafer into ca. 1×1 cm pieces, the full device is fabricated on each piece via the following procedures.

Starting from the conductive silicon wafer, a layer of amorphous $HfO_2$ is deposited via atomic layer deposition (FIG. 5B). Using Tetrakis(dimethylamino)Hafnium (TDMAH) (Sigma-Aldrich, CAS Number: 19782-68-4), a film of $HfO_2$ is grown at 100° C. with 200 ms pulses of water oxidant and 13 ms pulses of TDMAH in a Lesker ALD-150 LE with ozone co-feed option. This achieves a linear $HfO_2$ film growth: the resulting film grown by 500 $HfO_2$ ALD cycles on the device is 70 nm thick.

Graphene, purchased as a single layer on copper foil (Graphene Supermarket, SKU: CVD-Cu-2X2), is then transferred on top of the $HfO_2$ dielectric layer, with the procedure as described in Example 1 (see FIG. 5C). The graphene on copper foil is first coated and protected in PMMA followed by both an oxygen plasma etch and a copper removal, leaving the graphene on the PMMA. The PMMA/Graphene is then scooped onto the $HfO_2$/Si substrate, where the PMMA is removed leaving behind the large sheet (~1 $cm^2$) single- and multi-layer graphene (FIG. 5C, FIG. 6C). Both single and multi-layer graphene is observed by Raman spectroscopy (FIG. 6J).

Copper (Cu) particles are added by incipient wetness of Cu-nitrate solution onto the graphene and dried in flowing $N_2$ at 150° C. before reducing the device in flowing $H_2$ at 150° C., yielding the complete copper catalytic capacitor device.

Several embodiments have been described. Nevertheless, it will be understood that various modifications may be made without departing from the spirit and scope of disclosure. Accordingly, other embodiments are within the scope of the following claims.

What is claimed is:

1. A catalytic device comprising:

a catalyst material comprising a surface configured to be exposed to and contact one or more chemical reactants;

an electrically conductive carbon material in contact with the catalyst material;

an electrically conductive layer; and a dielectric material in contact with the electrically conductive carbon material and the electrically conductive layer, wherein the electrically conductive layer is configured to apply a bias voltage to the catalyst material, and the catalytic device is configured to catalyze a conversion of the one or more chemical reactants to one or more chemical products.

2. The catalytic device of claim 1, wherein the electrically conductive carbon material comprises one or more of graphene, porous graphene foams or sheets, carbon nanotubes, amorphous carbon film, carbon fiber, graphite, activated carbon, carbon black, diamond, fullerenes, carbon felt, carbon foam, carbon paper, carbon brush, and carbon cloth.

3. The catalytic device of claim 1, wherein the catalyst material comprises one or more of a metal oxide, a mixed metal oxide, a metal, a metal dichalcogenide, and a mixture of metals.

4. The catalytic device of claim 1, wherein the catalyst material is in the form of a continuous film, single atoms, nanoclusters, clusters, a two-dimensional material, or discontinuous film.

5. The catalytic device of claim 1, wherein the dielectric material comprises one or more of hafnium oxide, hafnium dioxide, silicon dioxide, titania, titanium oxide, zirconium dioxide, barium titanate, potassium niobate, titanate, lithium tantalite, tantalum pentoxide and strontium titanate.

6. The catalytic device of claim 1, wherein the dielectric material comprises a ferroelectric material or a paraelectric material.

7. The catalytic device of claim 1, wherein the dielectric material comprises a doped material.

8. The catalytic device of claim 1, wherein the electrically conductive layer comprises silicon or a metal.

9. The catalytic device of claim 1, wherein the dielectric material has a thickness of about 5 nm to about 100 nm.

10. The catalytic device of claim 1, wherein the electrically conductive carbon material has a thickness of about 70 pm to about 100 mm.

11. The catalytic device of claim 1, wherein the catalyst material has a thickness of about 70 pm to about 100 nm.

12. The catalytic device of claim 1, wherein the catalytic device comprises a first layer comprising the electrically conductive layer in contact with a second layer comprising the dielectric material.

13. The catalytic device of claim 12, wherein the second layer is in contact with a third layer comprising the electrically conductive carbon material.

14. The catalytic device of claim 13, wherein the third layer is in contact with a fourth layer comprising the catalyst material.

15. A method of catalyzing a conversion of one or more chemical reactants to one or more chemical products, the method comprising:

contacting a catalyst material of a catalytic device with the one or more chemical reactants, wherein the catalytic device comprises:

the catalyst material, wherein the catalyst material comprises a surface configured to be exposed to and contact the one or more chemical reactants;

an electrically conductive carbon material in contact with the catalyst material;

an electrically conductive layer; and a dielectric material in contact with the electrically conductive carbon material and the electrically conductive layer, wherein the electrically conductive layer is configured to apply a bias voltage to the catalyst material, and the catalytic device is configured to catalyze the conversion of the one or more chemical reactants to the one or more chemical products; and applying the bias voltage to the catalyst material to yield the one or more chemical products.

16. The method of claim 15, wherein the one or more chemical reactants comprise one or more of a nitro compound, ethylene, ethane, propane, butane, methane, propylene, and carbon dioxide.

17. The method of claim 15, wherein the one or more chemical products comprise one or more of hydrogen peroxide, oxygen ($O_2$), hydrogen ($H_2$), ammonia, carbon dioxide, methanol, ethanol, carbon monoxide, an amine, dimethyl ether, ethylene oxide, ethylene, propylene, butene, butadiene, propylene oxide, and carbon monoxide.

* * * * *